(12) United States Patent
Balboni et al.

(10) Patent No.: US 11,448,567 B2
(45) Date of Patent: Sep. 20, 2022

(54) SENSOR SYSTEM FOR MONITORING A VEHICLE AXLE AND FOR DISCRIMINATING BETWEEN A PLURALITY OF AXLE FAILURE MODES

(71) Applicant: DANA ITALIA S.R.L., Arco (IT)

(72) Inventors: Luca Balboni, Rovereto (IT); Carlos Maximiliano Giorgio Bort, Levico Terme (IT); Giulio Ornella, Arco (IT); Marco Scopesi, Bergamo (IT)

(73) Assignee: DANA ITALIA S.R.L., Arco (IT)

( * ) Notice: Subject to any disclaimer, the term of this patent is extended or adjusted under 35 U.S.C. 154(b) by 969 days.

(21) Appl. No.: 16/099,213

(22) PCT Filed: May 5, 2017

(86) PCT No.: PCT/EP2017/060807
§ 371 (c)(1),
(2) Date: Nov. 6, 2018

(87) PCT Pub. No.: WO2017/191313
PCT Pub. Date: Nov. 9, 2017

(65) Prior Publication Data
US 2020/0309641 A1    Oct. 1, 2020

(30) Foreign Application Priority Data

May 6, 2016 (EP) ..................................... 16425041

(51) Int. Cl.
*G01M 13/045*    (2019.01)
*G06F 30/27*     (2020.01)
(Continued)

(52) U.S. Cl.
CPC ............. *G01M 13/045* (2013.01); *G01K 7/02* (2013.01); *G01K 7/16* (2013.01); *G01M 13/028* (2013.01); *G06F 30/15* (2020.01); *G06F 30/27* (2020.01)

(58) Field of Classification Search
CPC .. G01M 13/045; G01M 13/028; G07C 5/0808
See application file for complete search history.

(56) References Cited

U.S. PATENT DOCUMENTS

2003/0066352 A1 * 4/2003 Leamy .................... F01D 21/00
                                                          73/659
2011/0219880 A1 * 9/2011 Klos .................... G01M 13/045
                                                          73/587
(Continued)

FOREIGN PATENT DOCUMENTS

DE     4447288 A1 *  7/1995  ......... G05B 19/4184
EP     2253819       11/2010
(Continued)

OTHER PUBLICATIONS

European Patent Office, International Search Report with Written Opinion issued in PCT/EP2017/060807, dated Jun. 26, 2017, 16 pages, European Patent Office, Rijswijk, Netherlands.

*Primary Examiner* — Douglas X Rodriguez
*Assistant Examiner* — Carl F. R. Tchatchouang
(74) *Attorney, Agent, or Firm* — McCoy Russell LLP

(57) ABSTRACT

A method of monitoring a vehicle axle, and of discriminating between a plurality of axle failure modes, is described. The method may include acquiring first axle data and second axle data, detecting at least one first anomaly if the acquired first axle data deviate from first reference data provided by a model of the axle, detecting at least one second anomaly if the acquired second axle data deviate from second reference data, detecting at least one out of a plurality of axle failure modes based on which anomaly or which anomalies (Continued)

have been detected, and issuing a failure notice indicative of the at least one detected axle failure mode.

20 Claims, 15 Drawing Sheets

(51) Int. Cl.
*G06F 30/15* (2020.01)
*G01K 7/02* (2021.01)
*G01K 7/16* (2006.01)
*G01M 13/028* (2019.01)

(56) References Cited

U.S. PATENT DOCUMENTS

2014/0130587 A1* 5/2014 Von Herzen ....... G01N 33/2888
73/114.55
2016/0334790 A1* 11/2016 Rust ................... B62D 15/0215

FOREIGN PATENT DOCUMENTS

| EP | 2365310 | | 9/2011 | |
| EP | 2365310 A1 * | | 9/2011 | ............ G01M 13/04 |
| EP | 2682322 A1 * | | 1/2014 | .......... B61L 15/0081 |
| EP | 2853879 A1 * | | 4/2015 | ............ G01M 17/10 |
| WO | 2009138106 | | 11/2009 | |
| WO | WO-2009138106 A1 * | | 11/2009 | ............. G06F 30/23 |
| WO | 2014161590 | | 10/2014 | |
| WO | WO-2015178826 A1 * | | 11/2015 | .......... F16C 33/6688 |

\* cited by examiner

| | | Information to be acquired | | | | |
|---|---|---|---|---|---|---|
| | | Vibrations of the mechanical components into the axle | Shocks on the axle and wheel hub | Fine and coarse metallic debris into lubrication oil | Temperature of lubrication oil | Viscosity of lubrication oil | Variation of the dielectric constant of lubrication oil |
| Damaging factor | 1. Wear of rotating components | ■ | | ■ | | | |
| | 2. Breakage of rotating components | ■ | ■ | ■ | | | |
| | 3. Damages of the structure of the axle | | ■ | | | | |
| | 4. Aging of lubrication oil. | | | | | ■ | ■ |
| | 5. Contamination of water into lubrication oil. | | | | | ■ | ■ |
| | 6. Lubrication oil below minimum low level | | | | ■ | | |
| | 7. Overheating axle | | | | ■ | | |
| Sensor | Inertia Measurement Unit | ■ | ■ | | | | |
| | Thermometer | | | | ■ | | |
| | Oil Debris Sensor | | | ■ | | | ■ |
| | Oil Viscosity Sensor | | | | | ■ | |

| Damaging factor / Sensor | Vibrations of the mechanical components into the axle. | Shocks on the axle and wheel hub. | Fine metallic debris into lubrication oil. | Coarse metallic debris into lubrication oil. | Temperature of lubrication oil. | Viscosity of lubrication oil. | Variation of the dielectric constant of lubrication oil. |
|---|---|---|---|---|---|---|---|
| 1. Wear of rotating components | ■ | | ■ | | | | |
| 2. Breakage of rotating components | | ■ | | ■ | | | |
| 3. Damages of the structure of the axle | | ■ | | | | | |
| 4. Aging of lubrication oil | | | | | | ■ | ■ |
| 5. Contamination of water or solvents into lubrication oil | | | | | | ■ | ■ |
| 6. Lubrication oil below minimum low level | | | | | ■ | | |
| 7. Overheating axle | | | | | ■ | | |
| IMU – S,imu,wear | ■ | | | | | | |
| IMU – S,imu,damage | | ■ | | | | | |
| Thermometer – S,temp | | | | | ■ | | |
| Oil Debris Sensor – S,debr,diel | | | | | | | ■ |
| Oil Debris Sensor – S,debr,contam | | | | | | ■ | |
| Oil Debris Sensor – S,debr,wear,fine | | | ■ | | | | |
| Oil Debris Sensor – S,debr,wear,coarse | | | | ■ | | | |
| Oil Viscosity Sensor – S,visc | | | | | | ■ | |

| Damaging factor | Flags raised by sensors |
|---|---|
| 1. Wear of rotating components | Simu,wear; Sdebr,wearFine; Stemp |
| 2. Breakage of rotating components | Simu,damage; Sdebr,wearCoarse |
| 3. Damages of the structure of the axle | Simu,damage |
| 4. Aging of lubrication oil. | Simu,wear; Sdebr,wearFine; Stemp; Svisc; Sdebr,diel |
| 5. Contamination of water into lubrication oil. | Sdebr,diel |
| 6. Lubrication oil below minimum low level | Sdebr,diel |
| 7. Overheating axle | Stemp |

Fig. 14

SENSOR SYSTEM FOR MONITORING A VEHICLE AXLE AND FOR DISCRIMINATING BETWEEN A PLURALITY OF AXLE FAILURE MODES

BACKGROUND OF THE INVENTION

The present invention relates to a Sensor system for monitoring a vehicle axle, in particular an axle for an off-highway vehicle, and for discriminating between a plurality of axle failure modes. The invention further relates to an axle arrangement including this sensor system.

Off-highway (OH) vehicles are typically used for handling heavy loads under various conditions that may stress the vehicle chassis and the axles. Thus, in order to improve the operational and financial efficiency of the vehicle it is preferable to maximize the reliability and to minimize the maintenance costs of each vehicle subsystem.

Therefore, the problem addressed by the present invention consists in defining a sensor network configured to monitor and predict the health status of a vehicle axle, in particular of an OH axle, with preferably great efficiency and reliability.

This problem is solved by a sensor system according to claim 1. Special embodiments are described in the dependent claims.

SUMMARY OF THE INVENTION

The proposed sensor system comprises:
a first axle sensor for acquiring first axle data;
at least one second axle sensor for acquiring second axle data;
at least one memory storing or configured to store at least one model of the axle and/or of one or more axle subsystems; and
a data processing unit in (also termed data logger) communication with the first axle sensor, the second axle sensor, and the memory, wherein the data processing unit is configured or programmed to:
detect at least one first anomaly if first axle data acquired by the first axle sensor or if the processed first axle data deviates from first reference data provided by the model or provided by one of the models when the model is stored in the memory;
detect at least one second anomaly if second axle data acquired by the second axle sensor or if the processed second axle data deviates from second reference data;
detect at least one out of a plurality of axle failure modes based on which anomaly or which anomalies have been detected; and
issue a failure notice indicative of the at least one detected axle failure mode.

The failure notice may be issued through an output device such as a screen, a display panel, one ore more lamps, or an acoustic alarm device, for example.

The first axle sensor may comprise an inertia measurement unit (IMU) for determining an acceleration and/or an attitude of the axle. Typically, the IMU comprises at least one accelerometer and/or at least one gyrometer. Usually, the accelerometer and/or the gyroscope have one, two, or three mutually perpendicular sensing axes. The gyroscope and the accelerometer may mounted on a common PCB support (which defines the physical boundary of the IMU), but they can also be situated on the same chip (i.e. one single ceramic package). Any architecture of the IMU is suitable for the proposed sensor system.

For example, the IMU may be used to acquire vibrational axle data at one or more locations in or on the vehicle axle. The vibrational data may include a time course of an attitude and/or an acceleration sensed by the IMU. The vibrational data acquired by the IMU may be indicative of one or more of the following axle failure modes:
wear and/or breakage of one or more rotating or rotatable axle components; and
damages, in particular deformations of the axle structure, for example of the axle frame.

The first axle sensor may also comprise a temperature sensor, in particular a thermocouple or a resistance thermometer, for determining a temperature of a rigid axle component and/or of a lubricant disposed within the axle for lubricating the rotating or rotatable axle components. Typically, oil is used as a lubricant.

The at least one second axle sensor may comprise one or more of the following sensors:
an IMU or a temperature sensor as previously described;
a debris sensor, in particular including a Hall-sensor, for detecting ferrous debris dispersed in a lubricant disposed within the axle;
a dielectricity sensor for determining the dielectric constant of the lubricant; and
a viscosity sensor, in particular an acoustic wave viscosity sensor, for determining the viscosity of a lubricant disposed within the axle.

For example, the debris sensor may include a magnet for producing a magnetic field and a further sensor configured to detect or measure a variation of the magnetic field close to the further sensor due to metallic particles dispersed in the lubricant. The debris sensor may further include two electrodes arranged at a distance, wherein a change of an electric conductivity and/or of an electric capacity of the electrode arrangement may be sensed depending on the abundance and/or density of ferrous debris dispersed in the oil (measured in particles per $cm^3$, for example).

The memory and the data processing unit may be configured such that the model or one of the models further provides the second reference data when the model is stored in the memory. In other words, both the first reference data and the second reference data may be provided by a model or by different models.

The sensor system or sensor network may further comprise at least one vehicle status sensor in communication with the data processing unit and/or with the memory, the vehicle status sensor configured to determine a vehicle status. For example the vehicle status may comprise one or more of the following quantities:
a rotational speed of at least one vehicle wheel,
a rotational speed of at least one transmission shaft,
a rotational speed of at least one axle shaft,
a gear selection, and
an engine speed.

The data processing unit may be configured to adapt the model or at least one of the models, for example the model providing the first reference data and/or the model providing the second reference data or some of the second reference data, based on the vehicle status. Thus, the first reference data and/or the second reference data provided by the model or provided by different models may be dependent on the vehicle status. The vehicle status can potentially influence the quantities acquired by the first and/or the second axle sensor. By adapting the model based on the vehicle status, the vehicle status is taken into account when detecting an anomaly of the axle or of an axle subsystem. Typically, the vehicle status sensor includes one or more rotational speed sensors.

The model or at least one of the models may comprise a theoretical model of the axle, in particular of an intact axle and/or of a defective axle. For example, the model may predict one or more spectral features of vibrational axle data acquired at one or more locations on or inside the axle. The data processing unit may then preferably be configured to run a classification algorithm to detect, based on the theoretical model and based on newly acquired first and/or second axle data, if the newly acquired first and/or second axle data features at least one of the first anomaly and the second anomaly.

Additionally or alternatively, the model or one of the models may comprise a learned set of first and/or second axle data corresponding to an intact axle and/or corresponding to a defective axle, and a classification algorithm configured to detect, based on the learned set of first and/or second axle data and based on newly acquired first and/or second axle data, at least one of the first anomaly and the second anomaly associated with the newly acquired first and/or second axle data. For example, the learned first and/or second axle data may be acquired by the first and/or the second sensor when the axle is intact, such as during a time period beginning right after production or right after maintenance of the axle. Also, it is conceivable that in order to acquire the learned first and/or second axle data, the axle or an identical further axle is damaged in a targeted manner, so that the behavior of this particular damage and its effect on the first and/or second axle data acquired by the axle sensors may be included in the model. In this manner, the model may be adapted to recognize this particular damage or axle failure mode.

In one configuration of the system, the first or the second axle sensor may include an IMU and the first/second axle data comprise currently acquired axle vibrational data. The first and/or the second reference data provided by the model may then include learned axle vibrational data, preferably acquired from an intact axle. The data processing unit may then be configured to classify, by running a classification algorithm, the currently acquired axle vibrational data as coinciding or being compatible with the learned axle vibrational data, or as deviating from the learned axle vibrational data. The data processing unit may then further be configured to detect that a rotating component of the axle and/or the axle frame features an anomaly if the currently measured axle vibrational data is classified as deviating from the first/second reference data, for example by more than a predetermined threshold.

In another configuration of the system, which may be combined with the previously described configuration, the first or the second axle sensor may again include an IMU, and the first/second axle data may comprise currently acquired axle vibrational data. As opposed to the previously described configuration, the model or one of the models may be a model of a defective axle, in particular a model of an axle including worn out or broken rotating components and/or a deformed or broken axle frame. The first/second reference data provided by the model may then include predicted spectral features of axle vibrational data associated with the modeled defective axle. For example, a frequency spectrum of the first and/or second reference data provided by the model may comprise a peak in amplitude at one or more particular frequencies. The data processing unit may in this case be configured to detect that one or more rotating components and/or the axle frame feature an anomaly if the spectral features predicted by the model of the defective axle are present in the currently acquired axle vibrational data.

In another configuration of the system, which may be combined with one or more of the previously described configurations, the first or the second axle sensor may include a temperature sensor and the first/second axle data may comprise temperature data currently acquired from a lubricant disposed within the axle. The model or one of the models may then include learned temperature data acquired from the lubricant by the temperature sensor. Preferably, the learned temperature data is acquired during a time period beginning right after a lubricant change when it can be assumed that the lubricant is fresh and has the desired quality and behavior. The first and/or the second reference data provided by the model may then include a minimum temperature rise time of the lubricant, wherein the minimum temperature rise time of the lubricant is based on or derived from the learned temperature data. For example, the temperature rise time may be the time that passes until the lubricant reaches a (steady) operating temperature or until the lubricant reaches a predetermined temperature. The data processing unit may then be configured to determine, based on the currently acquired temperature data of the lubricant, a current temperature rise time of the lubricant. The data processing unit may furthermore be configured to detect that the lubricant features an anomaly if the current temperature rise time of the lubricant is below the minimum temperature rise time of the lubricant provided by the model.

In another configuration of the system, which may be combined with one or more of the previously described configurations, the first or the second axle sensor may include a dielectricity sensor for determining a dielectric constant, for example the average dielectric constant, of a lubricant disposed within the axle, and the first/second axle data may comprise dielectricity data currently acquired from the lubricant. The model or one of the models may then include learned dielectricity data acquired from the lubricant by the dielectricity sensor. Preferably, the learned dielectricity data is acquired during a time period beginning right after a lubricant change when it can be assumed that the lubricant is fresh and has the desired quality and behavior. The first and/or the second reference data provided by the model may then include an acceptable range of the dielectric constant of the lubricant, wherein the acceptable range of the dielectric constant of the lubricant may be based on or derived from the learned dielectricity data. The data processing unit may then be configured to determine, based on the currently acquired dielectricity data, a current dielectric constant of the lubricant. Furthermore, the data processing unit may be configured to detect that the lubricant features an anomaly if a current dielectric constant of the lubricant derived from the currently acquired dielectricity data lies outside the acceptable range provided by the model.

In another configuration of the system, which may be combined with one or more of the previously described configurations, the first axle sensor may include a lubricant viscosity sensor for measuring the viscosity of a lubricant disposed within the axle, and the second axle sensor may include at least one of: a temperature sensor for measuring a temperature of the lubricant, a debris sensor for measuring an abundance/density of ferrous debris dispersed in the lubricant, and a dielectricity sensor for measuring a dielectric constant of the lubricant. The first axle data may comprise viscosity data currently acquired from the lubricant, and the second axle data may comprise at least one of: temperature data, debris data, and dielectricity data, all currently acquired from the lubricant, respectively. The model or one of the models may then include learned input data, the learned input data including at least one of: learned temperature data, learned debris data, and learned dielectricity data, and the model may further include learned viscosity data as output data, all previously acquired from the lubricant, respectively. Preferably, each data set of the learned data includes learned input data and learned output data acquired at the same time. The model may then further include a regression function derived from the learned data, the regression function providing a defined relation between the output data and the input data. Typically, the regression function includes the input variables as arguments or parameters and the output variable, namely the viscosity of the lubricant, as the dependent variable or value of the function. The first reference data provided by the model may then include an extrapolated lubricant viscosity, wherein the extrapolated lubricant viscosity is based on or derived from the second axle data and the regression function. The data processing unit may then be configured to detect that the viscosity features an anomaly if the currently acquired viscosity of the lubricant deviates from the extrapolated viscosity, for example by more than a predefined threshold.

In another configuration of the system, which may be combined with one or more of the previously described configurations, the second axle sensor includes a debris sensor for measuring the abundance and/or the density of ferrous debris dispersed in a lubricant disposed within the axle. Preferably, the abundance/density of the ferrous debris dispersed in the lubricant is measured in number of debris particles per volume of the lubricant, for example in number of particles per liter or per $cm^3$. The second axle data may comprise a measured time course of the abundance/density of ferrous debris dispersed in the lubricant. The second reference data may include an upper threshold, for example a predetermined upper threshold, of the abundance/density or of the time derivative of the abundance/density of ferrous debris dispersed within the lubricant. The data processing unit may then be configured to determine, based on the measured abundance/density of ferrous debris dispersed in the lubricant, a time derivative of the abundance/density of ferrous debris dispersed in the lubricant. Furthermore, the data processing unit may be configured to detect that at least one of the rotating axle components, an axle frame and the lubricant features an anomaly if the measured abundance/density or the time derivative of the abundance/density of ferrous debris dispersed in the lubricant exceeds the corresponding upper threshold.

In another configuration of the system, which may be combined with one or more of the previously described configurations, the model or one of the models may further include a plurality of learned data sets, each learned data set including learned first axle data and/or learned second axle data previously acquired by the first and/or the second axle sensor, and each learned data set further may include the time at which the data set was acquired. The model may further include a further regression function derived from the learned data sets, the further regression function providing a defined relation between the time at which the learned data sets were acquired and the first and/or second axle data included in the learned data sets. In other words, the time may be the input of the function and the variables related to the quantities acquired by the first and/or the second sensor may be the output of the further regression function. The data processing unit may then be configured to determine, based on the further regression function and based on one or more predetermined accepted ranges for the first and/or the second axle data, when, preferably expressed in number of operating hours of the axle, at least one of first and/or the second axle data is expected to lie outside their accepted range.

In all previously described configuration, the data processing unit may be configured to detect the at least one axle failure mode based on a predetermined table which assigns to each set of detected anomalies a predetermined set of axle failure modes.

Furthermore, an axle arrangement is presently proposed, in particular an axle arrangement for an off-highway vehicle. The proposed axle arrangement comprises:
an axle housing,
a differential, for example a central differential,
at least one wheel hub, and
the previously described sensor system, wherein the sensor system may include two or more of the following sensors:
at least one IMU disposed on the wheel hub or on at least one of the wheel hubs and/or disposed on the differential;
at least one temperature sensor disposed inside the wheel hub or inside at least one of the wheel hubs and/or disposed inside the differential;
at least one ferrous debris sensor disposed inside the wheel hub or inside at least one of the wheel hubs;
at least one dielectricity sensor disposed inside the wheel hub or inside at least one of the wheel hubs; and
at least one viscosity sensor disposed inside the wheel hub or disposed inside at least one of the wheel hubs.

BRIEF DESCRIPTION OF THE DRAWINGS

The above, as well as other advantages of the present invention will become readily apparent to those skilled in the art from the following detailed description when considered in the light of the accompanying drawings in which

FIG. 3 depicts different sensors that may be used to determine information that may be indicative of different damaging factors or axle failure modes;

FIG. 13 schematically illustrates the detection of an axle failure mode based on one or more detected anomalies;

FIG. 14 shows a predetermined table assigning detected anomalies to axle failure modes.

DETAILED DESCRIPTION OF THE INVENTION

Figure 1:
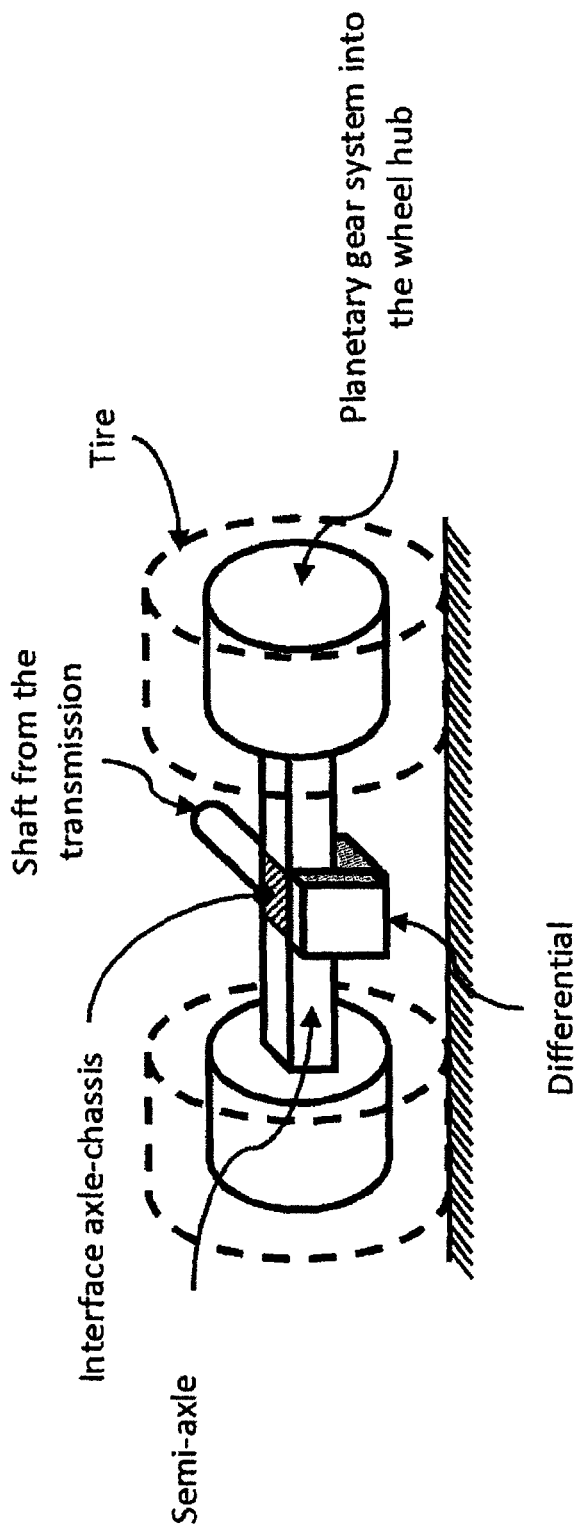
FIG. 1 shows an axle for an off-highway vehicle including a differential, semi axles and wheel hubs.

An architecture of an axle arrangement for an OH vehicle is shown in FIG. 1. The traction torque is delivered to the axle by a shaft that connects the mechanical transmission to a differential. The differential may be arranged in the center of the axle or off the center of the axle.

At each side the differential is connected to one shaft that is disposed inside the corresponding semi-axle in order to protect the shafts from external agents. The shafts transmit the traction torque to the wheel hub. A planetary gear system is disposed within each of the wheel hubs, the planetary gear systems transferring the traction torque to the wheels. The friction between the mechanical components in the axle (such as at least one of shafts, gears, bearings, and bushings) is reduced by using a lubrication oil. The oil is distributed across the whole axle due to the movement of its internal rotating parts. For brevity, in the following the term "rotating components" may include at least one of gears, bushings, bearings, and shafts.

The performance of OH vehicles depends strongly on the correct operation of the axle components. The most common failure modes of OH axles are the following:
1. wear of rotating components that evolves with a slow dynamic (such as compared to the vehicle dynamics) and may include at least one of adhesive wear, abrasive wear, surface fatigue, fretting, erosion, corrosion;
2. breakage of rotating components, typically evolving rapidly;
3. damage of the structure of the axle including the two semi-axles of FIG. 1 (e. g., without the rotating components);
4. lubrication oil below a minimum level;
5. overheating of the rotating components inside the axle;
6. aging of the lubrication oil.

The rate at which the oil degrades may depend on at least one of:
  temperature: the higher the temperature, the shorter the oil life;
  moisture: the more water (or other solvents) contamination, the faster the aging;
  catalytic reactions: oil aging is promoted by reactions with copper and other wear debris particles;
  wear of rotating components which increases the operating temperature of the driveline.

Preferably, at least one or all these failure modes should be addressed in order to maximize the reliability and the efficiency (mechanical and economical) of the axle. However, nowadays axle maintenance is usually carried out based on regular time-intervals (i.e. after a certain amount of operation hours), and includes pre-defined operations such as (but not limited to): the check and change of the lubricant oil, the greasing of rotating components, and the check of the magnetic oil drain plug that is used to capture metallic contaminants dispersed in the lubrication oil. Such metallic contaminants typically include residuals from the manufacturing process or may be produced by the wear of the rotating components.

The time-fixed maintenance of axles is however far from being optimal since the wear of mechanical components may depend mainly on how the vehicle has been used. Indeed, after a certain amount of operation hours, the mechanical components typically wear more rapidly if the driveline is put under high mechanical stress or if the vehicle is used under extreme environmental conditions, such as very high and/or very low temperatures. High stresses may be exerted on the axle when pulling heavy trailers, travelling across uneven terrains, or when carrying heavy loads. Extreme environmental conditions such as very high and/or very low temperatures typically alter the properties of the lubrication oil, thus accelerating the wear of the mechanical components of the axle.

Figure 2:
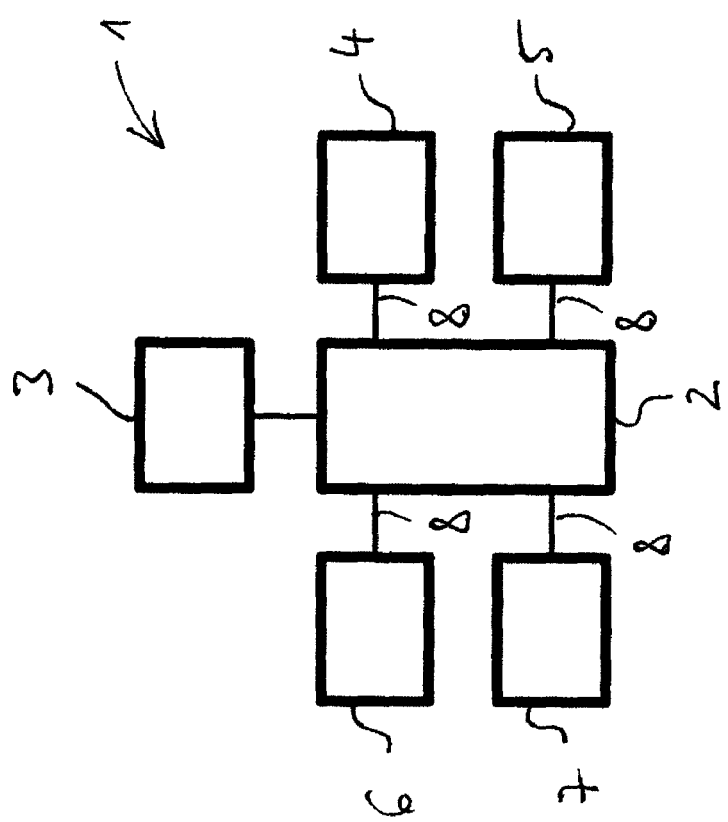
FIG. 2 schematically illustrates a sensor system according to the invention.

FIG. 2 schematically shows a sensor system 1 according to the invention. Here and in the following, recurring features are designated by the same reference signs. The sensor system 1 comprises a data processing unit 2 in communication with a memory 3. Furthermore, the data processing unit 2 is in communication with at least one of an IMU 4, a temperature sensor 5, a debris sensor 6 that may additionally be configured to measure a dielectric constant of the lubrication oil, and a viscosity sensor 7. The data processing unit 2, the memory 3, and the sensors 4, 5, 6, 7 may be in communication through wire-bound or wireless communication channels 8. It is understood that in alternative embodiments not depicted here the sensor system 1 may include only one of the sensors 4, 5, 6, 7 or subsets of the sensors 4, 5, 6, 7.

Among other things, the presently proposed sensor system 1 is innovative in regard to at least one of: the approach used to mount the components of the sensor system 1 in or on the axle; the methodology followed to fuse the acquired information and/or to discriminate between the different failure modes; and the methodology used to detect and/or predict axle failure modes.

Integration of the Sensor System in an OH Axle

The sensor system 1 (also termed sensor network) may include a set of sensors and/or transducers that are located or disposed in or on the axle, preferably in order to maximize the robustness of the collected information. The location of each sensor relative to the axle may affect the repeatability of the acquisition of information and of the signal-to-noise ratio (SNR). A location is optimal for installing a given sensor if it allows maximizing the repeatability of the measurement and maximizing the SNR. The set of sensors mounted in or on the axle may depend on the observables intended to be measured or on the type of data intended to be acquired. The various sensors and the information acquired by these sensors are summarized in FIG. 3.

Figure 4:
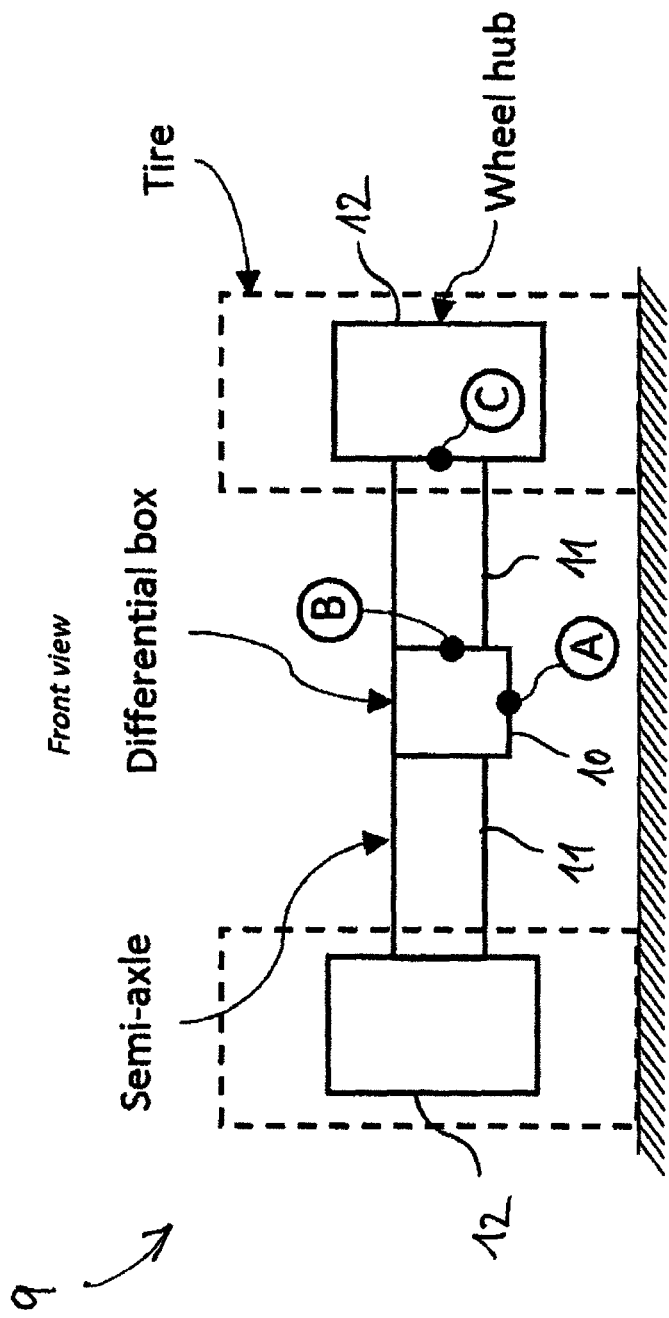
FIG. 4 shows locations on an axle for an off-highway vehicle at which the sensors shown in FIG. 2 may be mounted.

FIG. 4 depicts a possible location of each sensor inside or on the axle mechanical frame, focusing not only on the sensor/transducer itself but also on the system used to condition the measurement. Specifically, FIG. 4 depicts a vehicle axle comprising a differential, semi axles 11, and wheel hubs 12.

Inertial Measurement Unit

Usually, the ideal location for the IMUs 4 is as close as possible to the bearings and gears disposed inside the differential box and/or inside the wheel hub, so that anomalous periodic vibrations caused by worn or damaged gears, bearings, etc. may be sensed more easily. Such location can be inside or on the central differential and/or on one or both wheel hubs.

Figure 5:
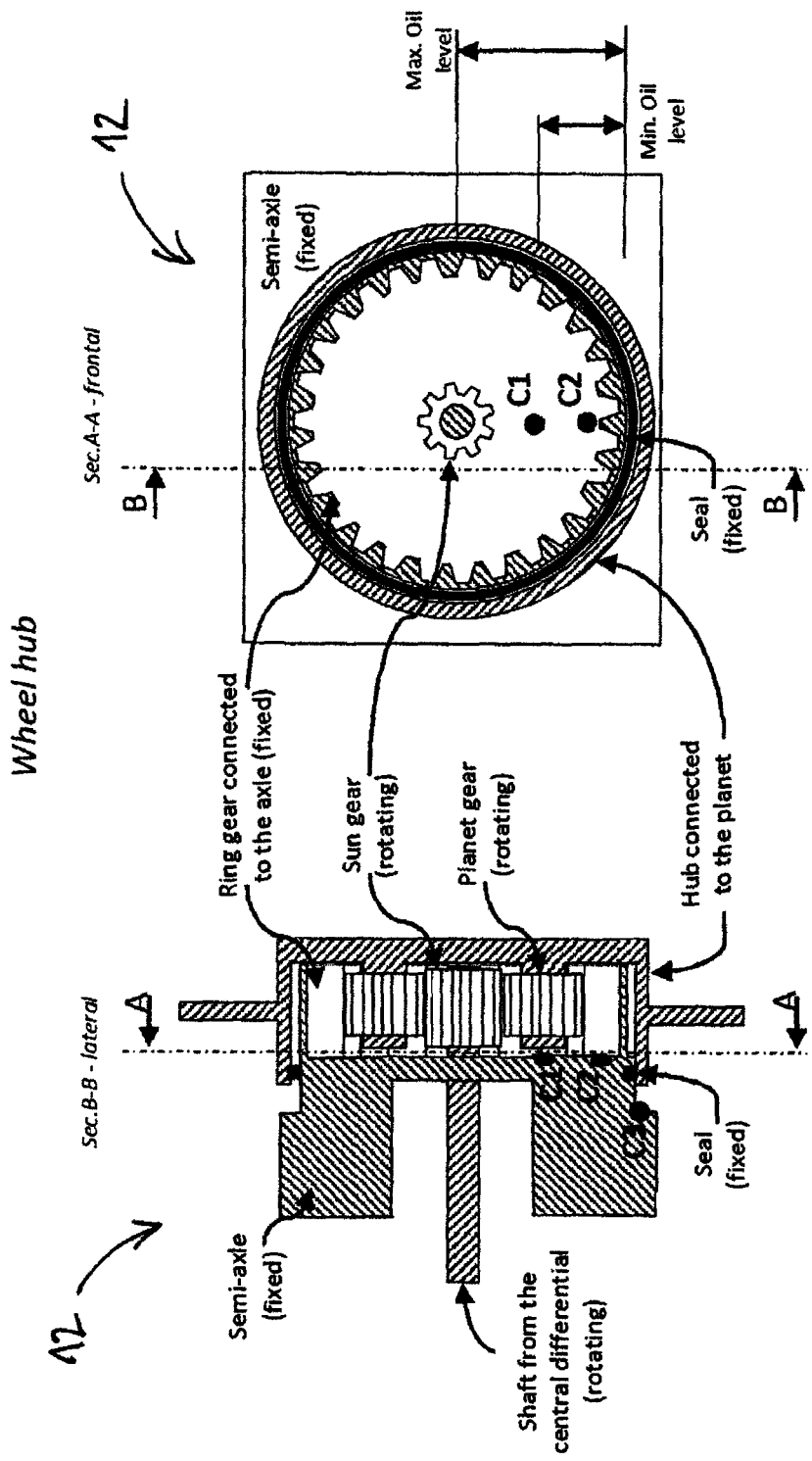
FIG. 5 shows a sectional side view and a front view of one of the wheel hubs shown in FIG. 4.

FIG. 5 shows a sectional view (left) and a front view (right) of one of the wheel hubs 12 shown in FIG. 4. The IMU 4 can be placed in position C3 on the wheel hub 12 (see FIG. 5, left) where it is close enough to the rotating parts of the wheel hub 12 and where it may be protected from external es. Moreover, the location C3—FIG. 5 is close to the sensors in position C1—FIG. 5 and in position C2—FIG. 5, thus facilitating the electrical connection of multiple sensors mounted inside the wheel hub 12 (the signal routing from the wheel hub 12 through the axle will be detailed further below).

Figure 6:
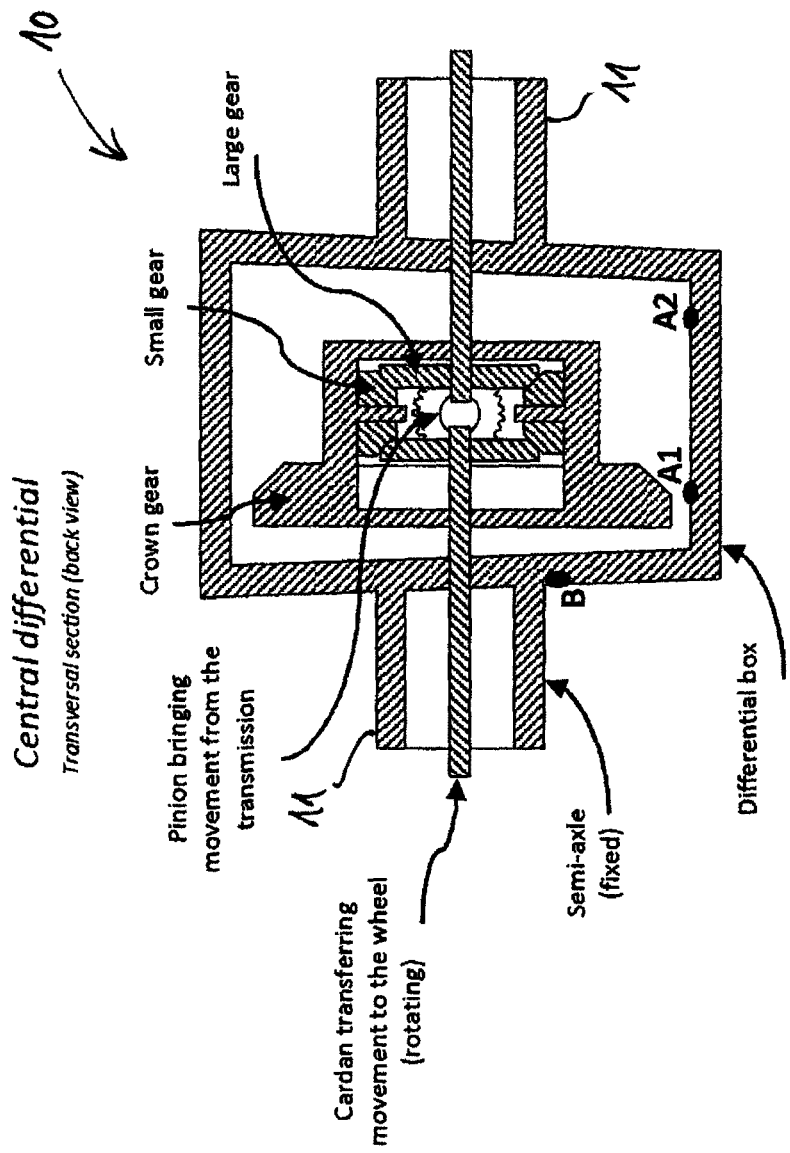
FIG. 6 shows a cross sectional view of the central differential shown in FIG. 4.

FIG. 6 shows a cross sectional view of the central differential 10 shown in FIG. 4. The ideal position of the IMU 4 on the central differential 10 is the location B—FIG. 6 since the latter is easily accessible for the installation of the IMU 4 and the SNR is typically higher, for example due to the local stiffness of the axle at this position. The measured vibrations are likely to be less sensitive to small bumps of the road. Yet, with the IMU 4 in this position it is typically still possible to sense anomalous periodic vibration patterns caused by worn rotating components inside the central differential box, and to sense large shocks caused by, for example, unsafe maneuvers of the vehicle during which the rear wheels of the vehicle may lift from the ground. If only one IMU is used, the location B—FIG. 6 (close to or at the sun gear of the differential 10) is generally preferable for the reasons given above.

Temperature Sensor

The temperature sensor 5 may comprise at least one of a conventional resistance thermometer and a thermocouple which may be placed in direct contact with the oil in order to measure the oil temperature. Inside the central differential box the temperature sensor 5 is preferably disposed at the bottom (location A1. FIG. 6) since most of the oil will gather in this location. It is generally beneficial to have more oil close to the temperature sensor 5 because a higher mass of liquid results in a higher thermal inertia which typically stabilizes the measurement.

The ideal location for the temperature sensor 5 inside the wheel hub could possibly be at position C1—FIG. 5. When located in this position, the temperature sensor 5 is typically immersed in the oil during normal operation of the axle 9, so that it may sense the average temperature of the oil (here the fluid is not stagnant but stirred by the rotation of the hub and planet gears). When the temperature sensor 5 in placed in this position it is typically possible to detect when the level of the oil is or falls below a minimum level since in this case the temperature sensor 5 is usually no longer wetted by the oil and measures the temperature of the air (which, in general, will be lower than the oil temperature). Moreover, temperature sensors may be integrated in the oil debris sensors as an extra functionality, and location C1—FIG. 5 is the preferred location for installing such sensors, as will be described further below.

Debris Sensor

Different types of oil debris sensors 6 are known from the prior art. For example, magnetic or conductive sensors may be chosen to be integrated or disposed inside the axle 9 due to their compact dimensions, their capability to withstand mechanical shocks, and due to their large range of operating temperatures. Whatever technology is chosen for the debris sensor 6, the debris sensor 6 should preferably be placed close to the rotating components and immersed in the oil. Preferably, the debris sensor 6 is disposed inside the central differential box (location A1—FIG. 6) and/or in or on one or both of the wheel hubs 12 (location C1—FIG. 5).

The location C1—FIG. 5 in the wheel hub 12 is well suited for installing an oil debris sensor 6 because in this position it will be submerged in the oil, and the oil is continuously stirred by the rotation of the hub and gears. Thanks to the turbulent flow of the oil in this zone, it will be easier to trap and sense metallic debris. If the oil debris sensor 6 is placed in the location C1—FIG. 5, it will also be possible to determine when the level of the lubrication oil falls below the minimum threshold, and if there are oil leakages. This functionality is enabled by two facts: almost all oil debris sensors known from the prior art can measure the dielectric constant of the oil, and the oil may reach the location C1—FIG. 5 when it is at its minimum level. When the oil debris sensor 6 measures a drop of the dielectric constant it will mean that it is no longer wetted by the oil (note that oil has a higher dielectric constant than air). Therefore, a drop in the measured dielectric constant may indicate that the oil level has fallen below the minimum threshold.

A drop in the dielectric constant of the lubrication oil can be measured not only when the oil is below a critical level, but also when the axle is tilted, e.g. when the vehicle is traveling on a slope. In order to avoid inaccurate measurements, the information on the dielectric constant of the lubrication oil may be merged with the information acquired by the IMU 4, so that it can be recognized when the debris sensor 6 is not wetted or not completely wetted by the lubrication oil, such as when the axle 9 is tilted.

Viscosity Sensor

Measuring the viscosity of the lubrication oil is a rapid way of determining its condition, with particular focus on the aging status of the oil. Three main types of viscosity sensors or three main methodologies for measuring the viscosity of the oil are known from the prior art: mechanical viscometers, electromechanical viscometers, and acoustic wave viscosity sensors. The latter are suitable to be installed in the axle 9 because of their compact dimensions, their resistance to harsh conditions such as vibrations, shocks, usage over a wide temperature range, and wide measurement range. Typically, the viscosity sensor 7 is configured or is used to measure the average viscosity of the lubrication oil. A well suited position for the viscosity sensor 7 inside the wheel hub 12 is the location C2—FIG. 5 since in this position at least one or all of the following requirements are typically fulfilled: the sensor is usually always wetted by oil; the sensor is exposed to a turbulent flow of oil, the turbulence being due to the movement of the gears; stagnant points at which the local properties of the liquid might be not representative of its average properties are avoided; and the viscosity sensor 7 is positioned as far away as possible from the oil debris sensor 6. The latter may be beneficial since magnetic oil debris sensors may generate a magnetic field that may attract the metallic debris dispersed in the oil. Close to the magnetic oil debris sensor 6 the physical properties of the oil may be altered, so that a viscosity measurement near the debris sensor 6 may possibly not be representative of the average viscosity of the oil inside the axle. Inside the differential box, the location A2—FIG. 6 typically satisfies at least one or all of the above-mentioned requirements.

Data Processing Unit and Connection of the Sensor Network

Figure 7:
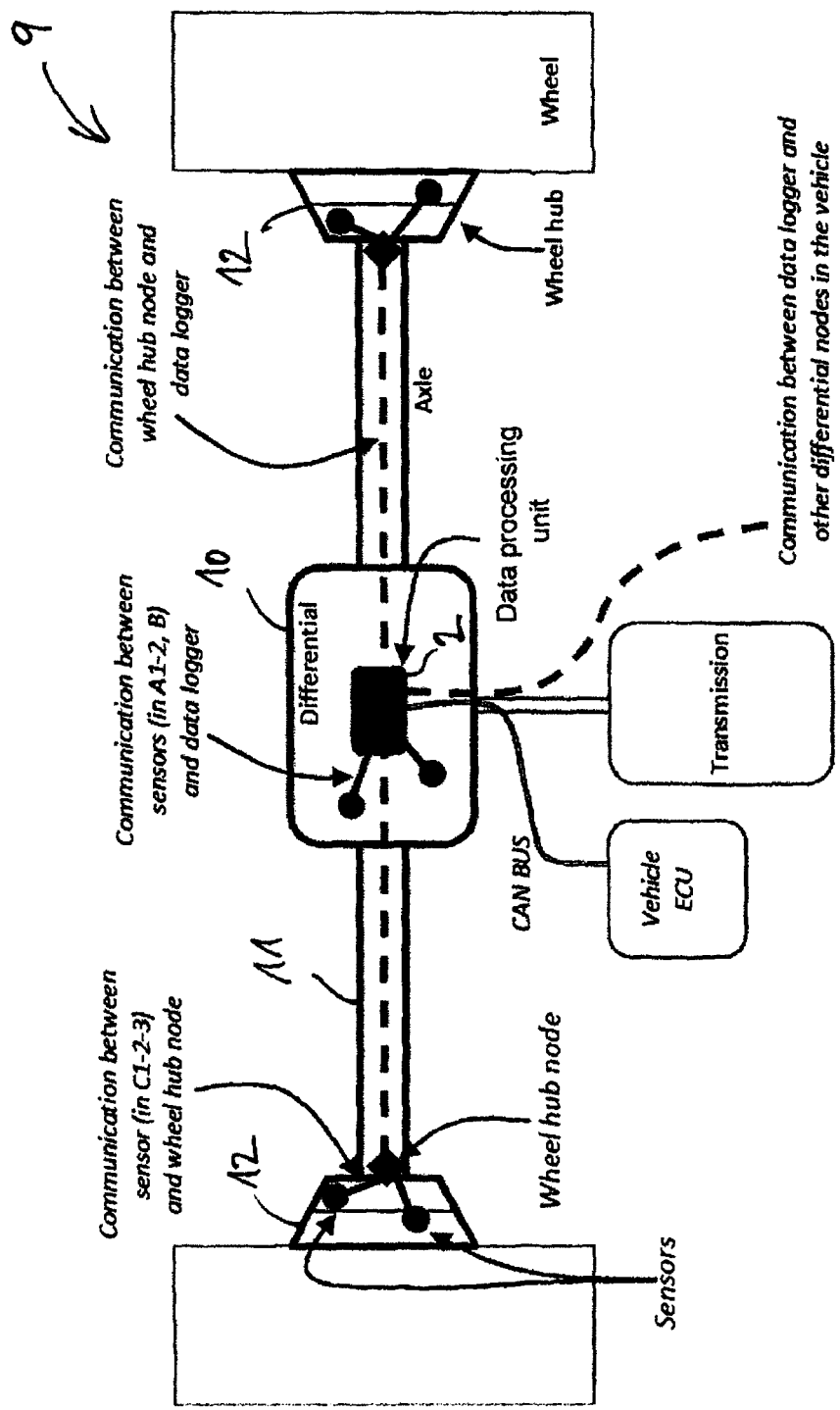
FIG. 7 shows the connections between the sensors and the data processing unit shown in FIG. 2.

One data processing unit, placed on the central differential box, may be used to acquire and process the axle data acquired by at least one or all of the sensors 4, 5, 6, 7 in the sensor network (FIG. 7). The exact location of the data processing unit 2 is usually application dependent and should be determined such that the device is protected from dangerous external factors (mud, water, etc.). The data processing unit 2 may be an industrial microcontroller and may be configured to receive or acquire electromagnetic signals from the sensor network, process information such as information based on the received electromagnetic signals from the sensor network, and output the results, e. g. on or via the vehicle CAN bus. Such data can be utilized by vehicle ECUs for a wide range of tasks, such as (but not limited to): diagnostics, prognostics, control algorithms etc. The data processing unit 2 may also be configured to acquire information from the CAN bus and to use this information to extend the information available for assessing the condition of the axle arrangement (as explained in the next section).

If more than one sensor network is mounted on the vehicle, usually only one of them comprises a data processing unit 2, while the others may have differential nodes (usually located on the central differential box). A differential node typically includes a simplified version of the data processing unit 2. For example, the differential node may act as a proxy since it may communicate to the data processing unit 2 (for example via a dedicated bus) the measurement data acquired by at least one of one or more wheel hub nodes and/or one or more sensors located or disposed inside the differential 10 of the axle. Usually, no mathematical operations or algorithms need to be carried out inside the differential nodes. A node on each wheel hub 12 may be used to group the signals acquired or received from the sensors, thereby simplifying the information flow across the axle 9 and providing modularity to the sensor system 1. The wheel hub nodes may then communicate the acquired measurement data to the data processing unit 2 (or to the differential node).

The communication of data between sensors, wheel hub nodes, and the data processing unit 2 can be wire-bound, wireless, or both. However, the chosen technology should preferably be compatible with the requirements of the data logging system. For instance, if the IMU 4 acquires data at a high sampling rate (such as at a rate higher than 100 Hz) a wired communication between the IMU 4, the wheel hub node and the data processing unit 2 is usually preferred.

Monitoring of the Health Status of the Mechanical Components of the Axle and of the Lubrication Oil The proposed sensor system 1 may be configured or programmed to perform a two step approach aimed at monitoring the health status of the rotating components of the axle 9: an intelligent data processing methodology, and a procedure used to identify the failure mode. All mathematical computations may be performed by the data processing unit 2.

Intelligent Data Processing

In order to perform a health assessment and/or prediction of the status of an OH axle, the data processing unit 2 is typically configured or programmed to process and/or to interpret the measured data. These operations are usually carried out using one or more of the innovative procedures described in this document. The proposed approach can be adapted to various operating conditions of the vehicle (e.g. to varying external temperatures), and even to variations of maintenance of services (e.g. if different greases or lubrication oils are used).

The data processing techniques developed for at least one of or each of the sensors 4, 5, 6, 7 are described in the next section. Each methodology aims at generating a flag if the sensor measures an anomaly. How these flags are combined to determine the failure modes is described further below. Note that the calibration of the sensors/transducers of the sensor system 1 is not described here since it can be performed with standard techniques, relying on dedicated laboratory tests, for example.

Intelligent Processing of IMU Data

The monitoring of the mechanical integrity of the axle 9 and of the wear of its mechanical components using vibration analysis typically relies on a temporal and/or on a spectral analysis of measured data, such as data acquired by the IMU 4.

When an accelerometer is placed on the OH axle, the recorded vibrations may be caused by one or more of the following factors: vibrations of the vehicle engine (which may excite the vehicle frame), vibrations of the transmission, patches of the tire, compliance of the tire, roughness of the road, movement of the suspensions, dynamics of the vehicle, or wear of the rotating components of the driveline (i.e. transmission and axles).

Figure 8:
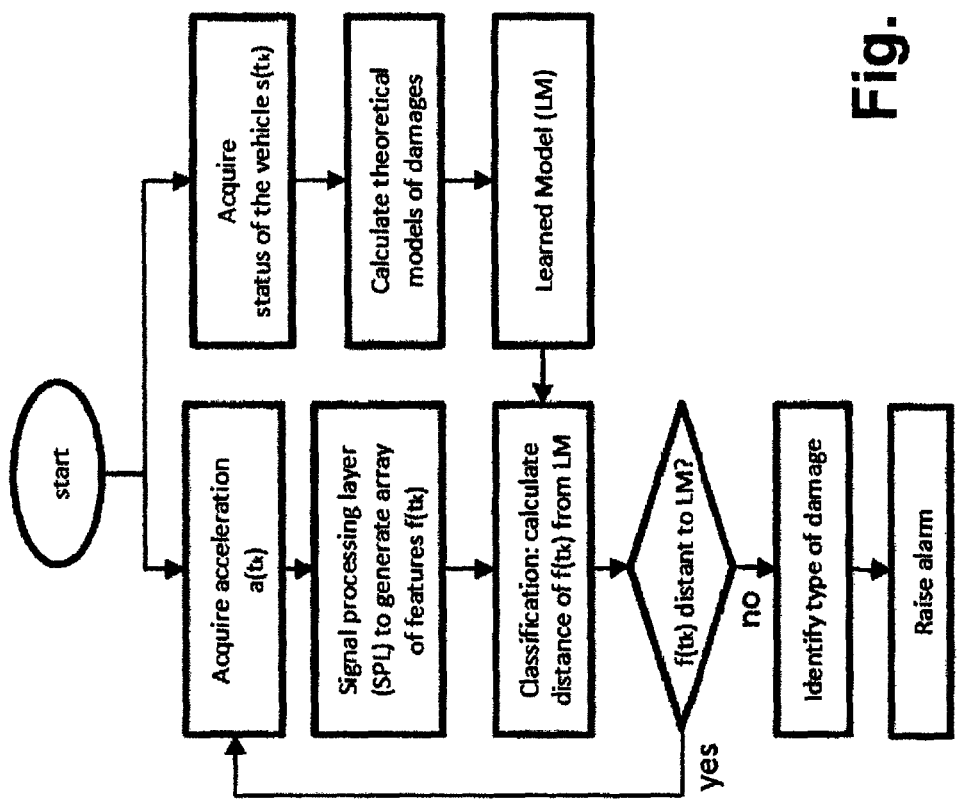
FIG. 8 schematically illustrates work steps of an algorithm used to identify an anomaly based in data acquired by the IMU shown in FIG. 2.

The problem of determining the status of the axle or axle arrangement typically consists in discriminating which of the recorded vibrations/accelerations are caused by wear of the rotating components or by a damage of the mechanical frame of the axle (such as a deformation of the axle frame), and which are not. This task may be formulated as a classification problem. Any classification algorithm can be used for this purpose, keeping in mind that the critical aspect is represented by the training of the classifier. For the sake of clarity and without loss of generality, a simple classification algorithm which may be run on the data processing unit 2 of the presently proposed system 1 will now be described by way of example (see FIG. 8).

The algorithm may start by acquiring the current status of the vehicle, e.g. via the CAN bus. The vehicle status may include at least one of or all of: the speed of one or more vehicle wheels, the speed of one or more transmission shafts, and the engine speed. Furthermore, the accelerometer or accelerometers of the IMU 4 may acquire acceleration/vibration data at a sampling frequency that is preferably at least twice the maximum gear mesh frequency such as the number of teeth of the gear multiplied by the rotational speed of the gear. The sampled status is referred to as $s(t_k)$, and the accelerations is referred to as $a(t_k)$ (see FIG. 8).

A signal processing layer (SPL) of the data processing unit 2 may process the measurement data $a(t_k)$ acquired by the IMU 4, for example by transforming the measurement data $a(t_k)$ in a state space suitable for the classification. The transformation carried out by the data processing unit 2 may include spectral analysis techniques which may include at least one of or all of: Fourier's transform, envelope analysis, kurtosis, spectral subtraction, wavelet decomposition, etc. The output of the SPL may include a feature array comprising information on the data acquired by the IMU 4.

Figure 9:
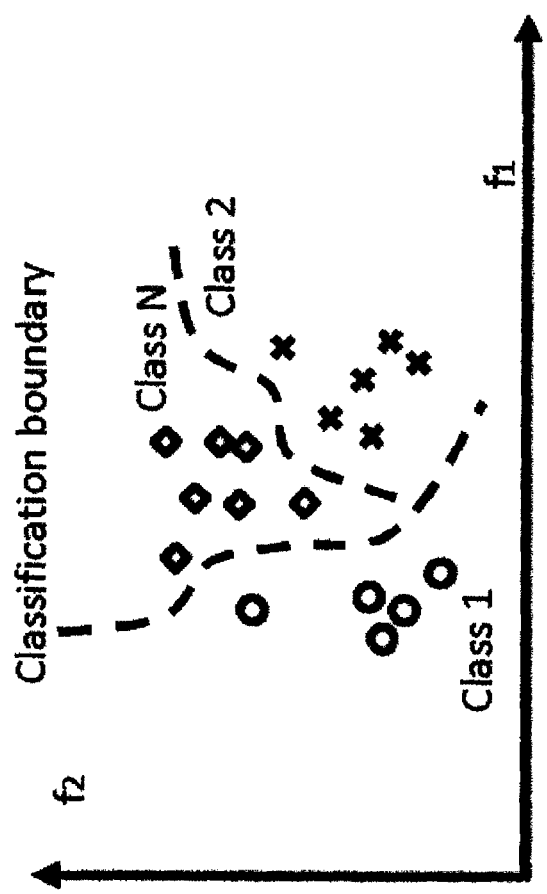
FIG. 9 schematically depicts a multiclass classification.

The classification may be aimed at detecting unexpected features or components in the current feature vector that may be caused by worn out rotating components and/or by a damaged axle frame, for example. In general, a classification algorithm may establish one or more boundaries that group a set of points based on a set of criteria (FIG. 9).

A critical aspect of classification systems is the definition of a robust reference data set with which the newly measured axle data acquired by the IMU 4 is to be compared. Here, the reference data set may be a model or the output of a model that may be updated based on the current status of the vehicle including at least one of or all of: a speed of one or more vehicle wheels, a speed of one or more gearbox shafts, a traction torque, etc. This adaptive model is referred to as a Learned Model (LM). LM can be represented as a set of arrays of features characterizing different wear modes of the rotating components inside the axle 9 and/or damaging modes of the axle frame. The classification algorithm may be run by the data processing unit 2 and may be configured to determine whether the measured feature array acquired by the IMU 4 contains any pattern included in the LM.

Figure 10:
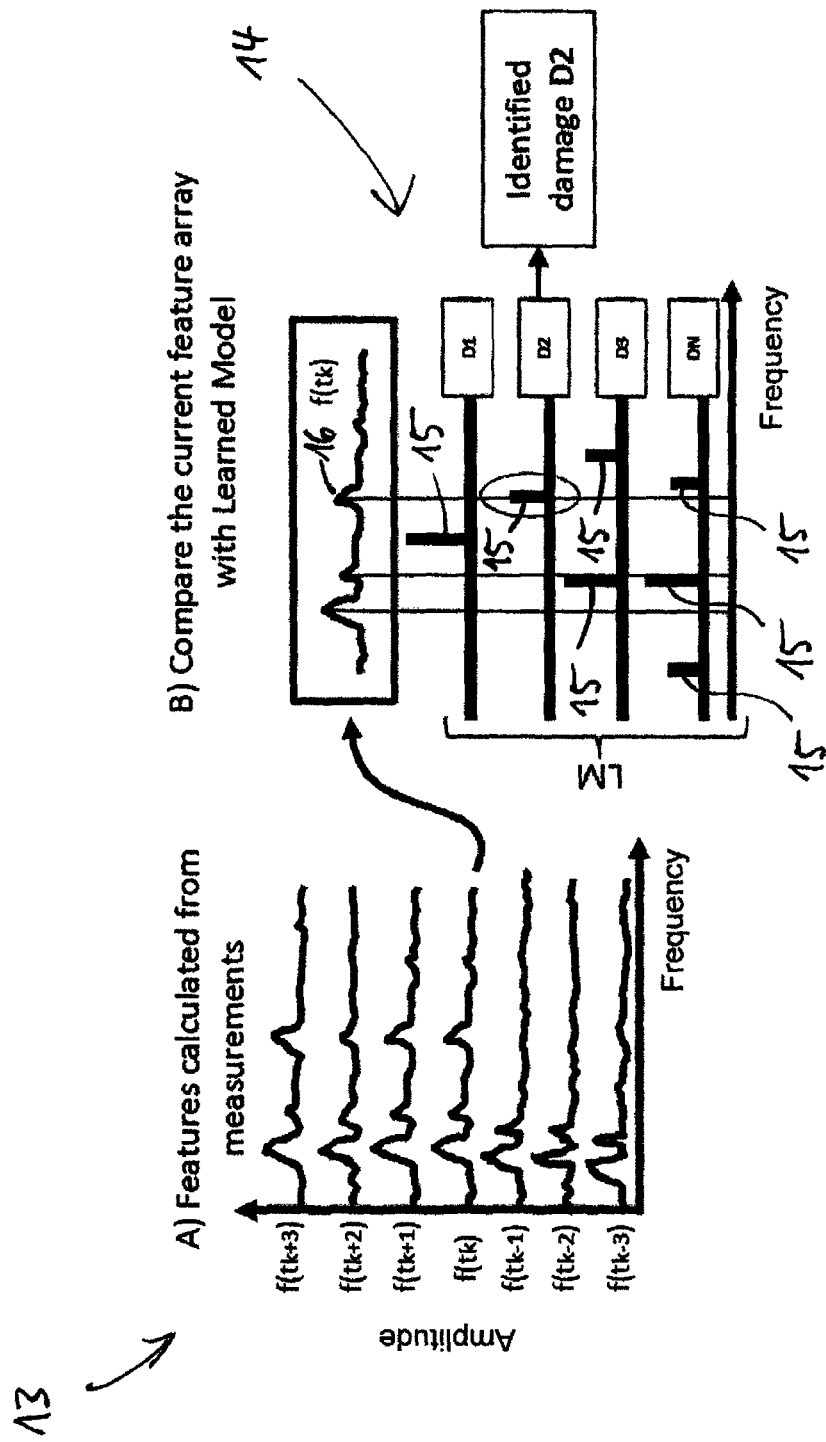
FIG. 10 shows measured vibrational data of the axle shown in FIG. 4 and vibrational data provided by a theoretical model of the axle.

By way of example FIG. 10 shows a set 13 of measured feature arrays f(tk−3), . . . , f(tk+3), possibly after they have been processed by the data processing unit 2. For example, the arrays f(tk−3), . . . , f(tk+3) may be the fourier spectra of measured vibration or acceleration data a(tk−3), . . . , a(tk+3). FIG. 10 further illustrates reference data 14 which may be provided by a model of a damaged axle. The reference data 14 shows that different damages D1, . . . , DN of an axle may be associated with different features in the fourier spectra that may be acquired by the IMU 4 and the data processing unit 2. In particular, the different damages D1, . . . , DN may be associated with peaks 15 of different amplitudes at different frequencies of the spectrum. The different damages D1, . . . , DN in FIG. 10 may represent or may be associated with different worn out rotating components inside the axle 9, for example. In FIG. 10, the spectral feature 15 associated with the second damage D2 is also present in the acceleration/vibration measurement data f(tk) acquired by the IMU 4 at time tk. In particular, f(tk) features a peak 16 of a similar amplitude and at a similar frequency as the feature 15 of the damage D2. The classification algorithm run by the data processing unit 2 may be configured to detect that the feature included in the spectrum associated with D2 is also present in the measured spectrum f(tk). Hence, the data processing unit 2 may be configured to detect that the rotating components of the axle 9 feature an anomaly known from LM.

The LM can be generated using one or more of the following approaches:

1. Theory: models of the wear modes can be obtained from theory.

2. Supervised learning: a skilled user may create a correlation between different wear modes and measured feature arrays.

3. unsupervised learning: in machine learning theory it is possible to find several approaches to implement unsupervised learning (in a more general way also called reinforcement learning). These approaches may be implemented on the data processing unit 2. For the sake of clarity, a simple implementation of unsupervised learning is described in the following.

For example, the data processing unit 2 may be configured or programmed to record the measured feature arrays during a time span long enough to be representative of different operating conditions to which the axle 9 is exposed, but also short enough to ensure that the mechanical properties of the axle are not deteriorating while the LM is being generated. For instance, such time span may include and/or may be limited to the first quarter of the total axle lifetime (for example, as estimated or predetermined by the axle manufacturer). During the remaining three quarters of the total axle lifetime, any recorded feature array that deviates from the predicted LM, for example by more than a predetermined threshold (where the threshold distance can be set based on the application), may be classified as anomalous and an anomaly may be detected (also referred to as the raising of a flag in the following), thus requiring an inspection of the wear of the axle. In order to improve the accuracy of this approach the LM may be extended by adding feature arrays to the LM. For example, these added feature arrays may be recorded immediately after the periodic maintenances of the axle 9.

4. Hybrid learning: the previously described techniques may be combined in order to improve the overall accuracy of the LM (and so of the classification). For instance, theoretical models can be combined with unsupervised learning in order to be able to identify damage modes not yet described by the theoretic model, while the theoretical models may still being be to discriminate between the most relevant wear modes. This methodology is typically the most complete. Note that the overall performance of the classification algorithm may possibly be enhanced by sharing learned models and classification results between different axles of the same vehicle or of different vehicles.

The output of the data processing carried out on the data acquired by the IMU 4 typically comprises two boolean flags Simu,wear and Simu,damage which state whether the rotating components of the axle are worn and/or whether the axle mechanical frame is damaged, for example broken or deformed.

Intelligent Processing of Temperature Sensor Data

The vehicle may possibly be utilized in extremely cold and hot environments. The temperature sensor 5 may be used for one or both of the following applications:

1. detect overheating of rotating components;

2. monitor the condition of the lubrication oil.

The latter functionality may be based on the concept that an aged oil warms-up more quickly than a fresh oil. The warm-up time may be defined as the duration of a time period that begins when the engine of the vehicle is started and that ends when the oil temperature has reached a stationary condition. The average warm-up time may be determined using any known filtering methodology (e.g. moving average).

The innovative intelligent algorithm run by the data processing unit 2 may autonomously learn the nominal average warm-up time of the lubrication oil, for example under different operating conditions. Furthermore, the data processing unit 2 may be configured or programmed to determine if the warm up time falls below a threshold value, in which case an anomaly may be detected (or, equivalently, a flag may be raised). As described in the next section, this flag may be merged with the information collected by one or more of the other sensors in the network, and a feedback may be provided to an operator of the vehicle comprising the axle 9.

Figure 11:
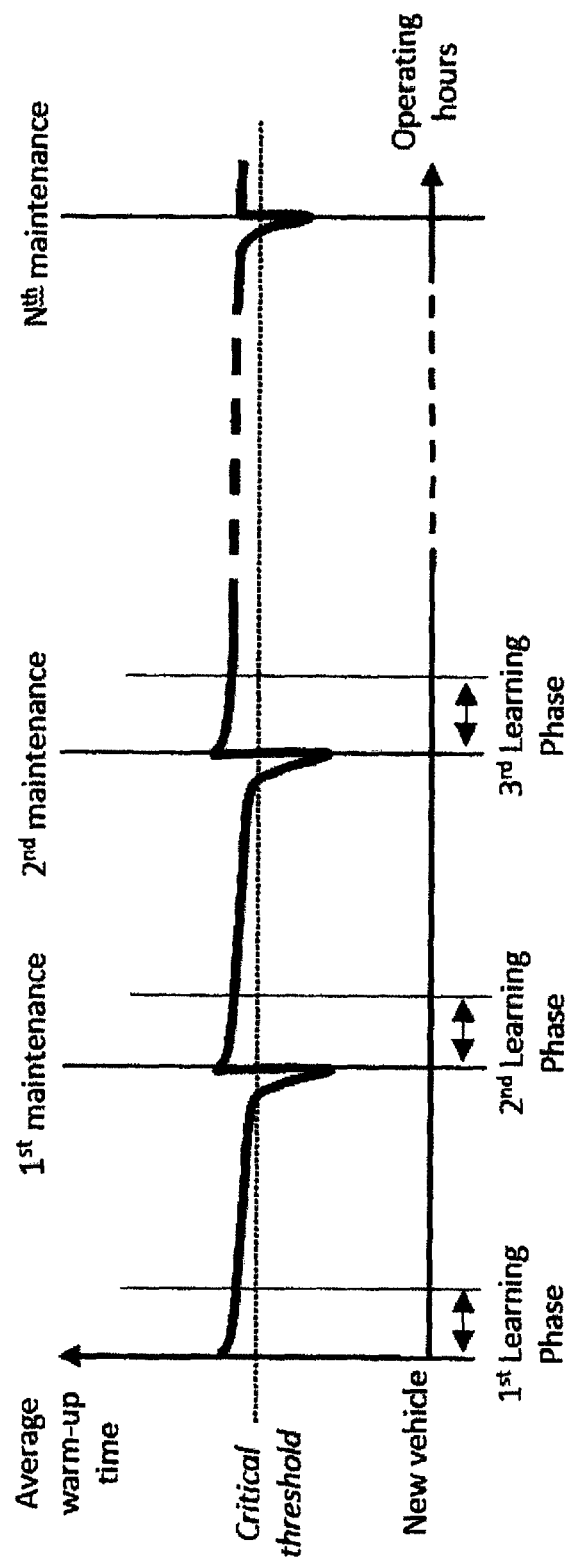
FIG. 11 shows a trend of an average oil warm-up time over the lifetime of the axle shown in FIG. 4.

The estimation of the nominal warm-up time may be carried out after each oil change (FIG. 11), and it may last for a time span that may include and/or that may be limited to a fraction (approx. 20-30%) of the average oil change interval time. The latter is typically provided by the axle manufacturer, but it can also be decided a priori based on the specific application. The critical threshold on the average warm-up time is typically application dependent, and it may be selected or set according to experimental tests carried out in the laboratory and aimed at identifying the maximum acceptable aging of the lubrication oil. Note that the threshold should be chosen as a compromise between a good oil quality (that is achieved with a low threshold), and reduced maintenance costs (i.e. too low thresholds may require frequent oil changes). The output provided by the temperature analysis may include an anomaly detection and/or a flag Stemp that is raised if or once the oil temperature is excessively high (overheating) or if or once the temperature is rising too quickly.

Intelligent Processing of Debris Sensor Data

Oil debris sensors are usually configured to estimate the amount of debris dispersed in the lubrication oil and/or the dielectric constant of the lubrication oil. These two measurements are discussed in the following.

1) Ferrous Debris in the Lubrication Oil

The dispersion of metallic debris in the lubrication oil is a phenomenon that may depend on the life of the axle and/or stresses the axle is subjected to. Due to the variability of these two factors, it is difficult to define an upper limit for the debris oil contamination.

The information collected from the debris sensor 6 may be an indication of the amount of dispersed fine and coarse particles (e.g. %, or parts per million). However, the particle dispersion is a measurement which may not be robust enough since during a normal axle lifecycle a high debris contamination may not always be associated with the wear of the mechanical components of the axle 9.

Figure 12:
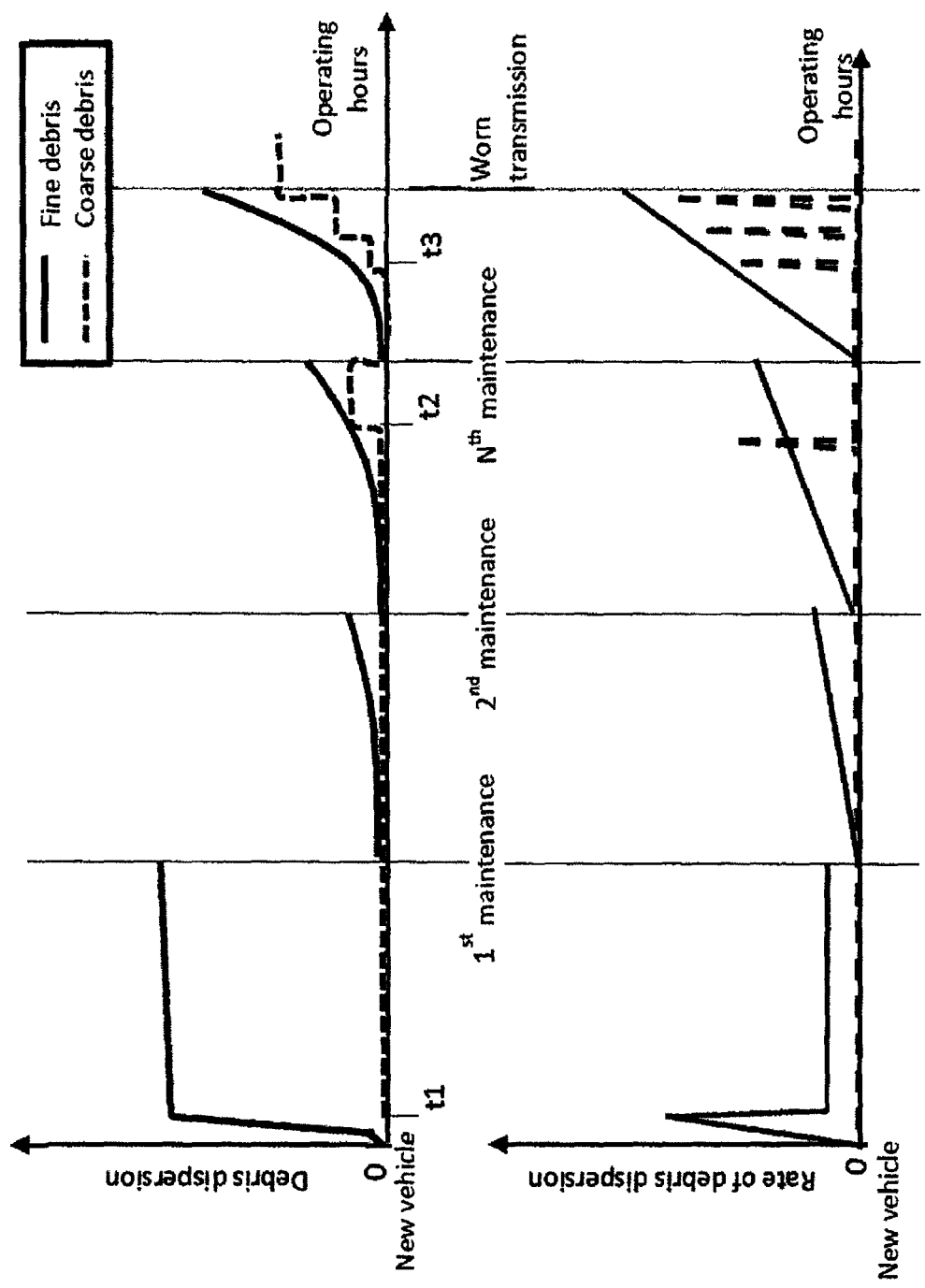
FIG. 12 illustrates the evolution of the abundance of ferrous debris in the lubrication oil disposed within the axle of FIG. 4.

Therefore, from the measured data the time derivative of the abundance and/or of the density of ferrous particles dispersed in the lubrication oil may be calculated. FIG. 12 shows the typical trend of the fine and coarse debris contamination in the oil, as well as time derivative (called rate in FIG. 12). For instance, in the beginning (t1) the level of contaminants in the lubrication oil is typically higher with respect to a nominal condition due to the presence of small manufacturing residues (such as chip produced during machining processes, or chemical products used to paint the axle). As long as the vehicle is used, the wear of rotating components (thus the contamination of fine debris) may increase, for example up to a point where bearings and gears start to deteriorate (t2 and t3). Note that each maintenance step may reset the amount of debris in the oil (since the oil is changed and the sensor is cleaned), however the time derivative of debris contamination is generally a more stable indicator since it is generally increasing in time due to the degenerative nature of the wearing mechanisms.

One or more of the following three anomaly notifications or flags may be provided by the data processing here described:

I. Sdebr,contam: states if the dispersion of fine debris in the lubrication oil exceeds a threshold, for example a predetermined threshold, and the physical properties of the oil are degrading. A threshold can be set to define the maximum tolerable debris contamination, for example based on experimental tests.

II. Sdebr,wearFine: the information on the rate of fine debris contamination may be filtered (thus avoiding instantaneous peaks in the signal due to noise) and/or monitored in order to detect whether wear of the rotating components is increasing anomalously.

III. Sdebr,wearCoarse: the flag may be raised if coarse debris is detected. This is an event that typically requires an immediate maintenance of the axle in order to avoid further damage.

A person of ordinary skill readily knows that a debris sensor may typically be used to distinguish coarse debris from fine debris. For example, if the debris sensor 6 includes a Hall-type sensor for detecting a change in a magnetic field produced by a magnet of the sensor, the rate at which the magnetic field changes due to the presence of ferrous particles in the lubrication oil typically increases as the size of the ferrous particles increases.

2) Dielectric Constant of the Lubrication Oil

The dielectric constant of a fluid or liquid typically depends on its temperature, moisture, and level of contamination. The nominal value of the oil viscosity should preferably not be set a priori since the lubrication oil might change between consecutive maintenance steps (e.g. the chemical composition of the oil may change).

The procedure followed to monitor the dielectric constant of the lubrication oil may be based on the same intelligent algorithm developed for monitoring the oil temperature described further above. After each maintenance, the system may learn, e. g. for a given time span, the average nominal dielectric constant of the oil, and may then monitor the deviation of the current dielectric constant from the average nominal value. If the current dielectric constant diverges excessively from its nominal value, for example by more than a predetermined threshold, a flag Sdebr,diel may be raised.

Intelligent Processing of Viscosity Sensor Data

The viscosity of the oil may be measured in order to determine whether the oil has aged and/or has to be replaced. The oil viscosity is mainly affected by one or more of the following:

oil aging: aged oil usually exhibits a larger viscosity;
oil temperature: oil viscosity usually decreases with oil temperature;
debris and contaminants dispersed in the oil: solid particles, water, and other solvents typically alter the oil viscosity;

Due to these factors, it may not be possible to recognize the oil aging by looking only at the instantaneous value of the viscosity and by comparing it to a reference value. Here, an intelligent algorithm is proposed that is configured to automatically learn a model of the oil viscosity and to use this model to assess and/or to predict oil aging.

The automatic learning of a model of the oil viscosity may be formulated as a regression problem. A regression problem may include a statistical approach for estimating relationships between variables. In the proposed regression problem at least one of or all of the oil temperature, the abundance of debris dispersed in the oil, and the dielectric constant of the oil measured at a given time instant tk (for brevity named inputs) may be correlated to oil the viscosity measured at the same time instant tk (named output). Any state-of-the-art regression algorithm may be used (e.g. Least Square Minimization, Neural Networks, Gaussian Processes, Support Vector Machines, etc.). The regression algorithm typically includes one or more of the following steps:

1) Regression (learning): measured oil temperature, abundance of debris dispersed in the oil, dielectric constant of the oil, and viscosity of the oil (preferably all acquired at the same time instant) may be used to reconstruct a relation between inputs and output. The output includes the oil viscosity, while the inputs may include one or more of the oil temperature, the abundance of debris dispersed in the oil, and the dielectric constant of the oil.

In order to improve the accuracy of the learned model (i.e. the regressed function), multiple sets of measurements may be utilized. This multiple set of measurements may be referred to as the training set. Each set of measurements in the training set may include inputs and outputs (acquired at a given time instant). The training set can be acquired for instance (but not limited to) during a predefined time span or time period that may start after the vehicle maintenance has been completed, and may last for and/or which may be limited to a fraction of the Mean Time To Maintain as estimated by the axle manufacturer. After each maintenance of the axle, the training set can be redefined or expanded. The preferred management of the training set is application dependent, but in general it is a preferable to continuously expand the training set in order to have more data available for the learning phase. The result of the regression typically includes a model that may correlate inputs with outputs based on a mathematical expression or a set of logic rules.

2) Extrapolation: once the relation between inputs and output is known, it is possible to calculate an estimation of the current viscosity of the oil for the current set of measured inputs including at least one of or all of: oil temperature, abundance of debris dispersed in the oil, and dielectric constant of the oil.

Note that the extrapolation can be done at any moment, even when the vehicle is new and the first learning phase has not yet been completed (i.e. no learned model is available). In this case the extrapolation of the current viscosity can be carried out by utilizing simplified models derived from theory or from laboratory tests. If such models are available, their results can be fused to the estimations made by the learned model in order to improve the overall accuracy of the extrapolation. Examples of data fusion algorithms that can be utilized may include one or more of: Bayesian filters, Kalman filter, Particle filters, etc.

The current measured viscosity of the oil may be compared with the current estimated viscosity. If the absolute value of the difference between the measured viscosity and extrapolated viscosity is greater than a predefined threshold, a boolean flag Svisc may be raised stating that the properties of the oil have deteriorated. The threshold can be selected a priori based on laboratory tests aimed at identifying the maximum allowed oil aging.

Identification of Failure Modes of the Mechanical Components of the Axle and of the Lubrication Oil Once the information collected by at least one or all of the sensors in the sensor network has been processed, the failure mode of the system may be identified. For sake of clarity, the proposed procedure is described for a subset of devices in the sensor network (e.g. the transducers placed in the wheel hub, or in the central differential 10). It is understood that this approach can be extended to other subsets of sensors in the network, preferably to all possible subsets of sensors in the network, including to all sensors. Basically, the innovative heuristic methodology is based on the concept that for some failure modes measurements carried out by two or more sensors in the sensor network are correlated.

FIG. 13 defines the information to be acquired for each damaging factor (i.e. failure mode), including the sensors to be used. By travelling backward this logical path it is possible to discriminate which failure mode is present. For instance, suppose that flags Simu,damage and Sdebr, wear-Coarse have been raised, for example based on the data measured by two or more sensors in the network. FIG. 13 depicts an example of the logical procedure that may be applied in order to identify the corresponding failure mode. For each flag the information provided is identified. In the example depicted in FIG. 13 this information includes: "shocks on the axle and the wheel hub", and "coarse metallic debris dispersed in the lubrication oil". The intersection or pairing of the information provided identifies the failure mode which is present in the axle or axle arrangement. For example, in the example depicted in FIG. 13 the axle failure mode includes the mode "breakage of rotating components". The approach described herein may be extended to each damaging factor or axle failure mode, thus obtaining the correlations between flags and failure modes shown in FIG. 14.

Estimation of the Residual Life of the Mechanical Components of the Axle and of the Lubrication Oil The estimation of the residual lifetime of the axle system may be estimated using a methodology that can be generalized to all subsets of the sensors/transducers in the sensor network, including to all sensors/transducers in the sensor network. For the sake of simplicity, in the following the information logged by a sensor in the sensor network is referred to as a "signal". The signal may include the information that is used to raise on ore more warning flags according to the data processing procedure described above, such as one or more of the following:

i) IMU: the IMU signal may include the descriptors of vibrational measurements (for instance—and without loss of generality-spectral components) caused by worn rotating components and a damaged axle frame.

ii) Thermometer: the thermometer signal may include the warm-up time of the oil.

iii) Oil debris sensor: the oil debris sensors signal may include one or more of the abundance of fine debris dispersed in the oil, the rate of change of the abundance of fine debris dispersed in the oil, the abundance of coarse debris dispersed in the oil, and the dielectric constant of the oil.

iv) Oil viscosity sensor: the oil viscosity sensor signal may include the absolute difference between the viscosity estimated from one ore more models and the measured viscosity.

Estimating the residual lifetime may be approached as a regression problem of one or more of the above-mentioned sensor signals, where the domain of the regression function may be defined over time or over the distance traveled by the vehicle. The regression algorithm may include the regression algorithm described above (data processing of the thermometer), it can be performed with any state-of-the-art regression algorithm, and it may consist of two phases: learning and extrapolation.

During the learning phase a mathematical model of the signal with respect to time (or space) may be automatically defined. The learning phase can be carried out after each maintenance of the transmission, and it may last and/or it may be limited to a fraction of the average Mean Time To Maintain, for example as defined by the manufacturer.

During the extrapolation phase the learned model may be used to estimate the value of the signal at a given future time instant (or future position). By inverting the learned model it is also possible to estimate when in the future time or after what distance traveled by the vehicle the signal will reach a threshold value, such as a predetermined threshold value, and to raise the error flag associated with the corresponding failure mode. If multiple signals are monitored and for each of them a time-to-raise (or space-to-raise) is predicted, it is possible to combine the estimations to predict when a given failure mode will occur.

Autodiagnosis Functionalities of the Sensor Network

The data processing unit 2 may be configured or programmed to have auto-diagnosis capabilities, meaning that it may be configured or programmed to monitor the health status of the logged sensors, wheel nodes, and central differential nodes. The auto-diagnosis may be enhanced by the modularity of the sensor network. If a failure is detected (e.g. it is not possible to acquire a sensor at predefined time intervals), the data processing unit 2 may communicate the failure to the vehicle ECU with dedicated messages, for example sent via the CAN bus.

The data processing unit 2 may be configured or programmed to adapt its functionalities based on recorded failures. For instance, if the IMU or another sensor in the sensor network breaks down, the data processing unit 2 may reduce the set of failure modes to be monitored to those failure modes that do not require the flags raised by the broken sensor and/or by the corresponding data processing procedure. The full functionalities may then be re-established if or once the broken sensor is replaced.

Automatic Emergency Assistance

The inertial measurement unit (IMU) may be configured to reconstruct or detect the attitude of the vehicle. Typically, this functionality may be enabled only for sensor network configurations including more than one IMU, thus achieving safety-compliant redundancy. An alarm may be raised and sent to the vehicle ECU via the CAN bus if or when a longitudinal or lateral inclination angle measured by the IMU exceeds a threshold, such as a threshold predetermined by the vehicle manufacturer, and/or if or when a shock is measured by the accelerometers of the IMU. By doing so, the system may support or warn the driver in case the vehicle is in danger of tipping over.

Preferred Sensor Network Configuration

The sensor network is a modular system in which each single sensor can be installed or removed according to the specific application. The preferred configuration of the sensor network requires a set of sensors (for example one or more IMUs, one or more thermometers, one or more debris sensors, and one or more viscosity sensors). For example, the sensors or at least some of the sensors may be disposed in the wheel hub or in each wheel hub and in a central differential box or in each differential box of the vehicle. In this way it is possible to monitor and predict the remaining lifetime of the principal components of all axles.

Variants

The innovative sensor network is designed in order to maximize its modularity. For the sake of clarity, the variants of the sensor network are described by means of sub-networks, sensor configurations, and axle locations.

Sub-Network

A sub-network may be defined as one of the following combinations of components (see FIG. 4):

I. Data processing unit, IMU in location B, thermometer in location A, oil debris sensor in location A, and viscosity sensor at location A.

II. Central differential node, IMU in location B, thermometer in location A, oil debris sensor in location A, and viscosity sensor at location A.

III. Wheel hub node, IMU, thermometer, oil debris sensor, and viscosity sensor in location C.

Sensor Configuration

A given sub-network can include all of the above-listed sensors, or a subset of sensors or transducers. According to the considerations summarized in FIG. 14, the combination of sensors in the sub-network defines the capability of the proposed sensor system to detect a failure, to discriminate the damaging factor or failure mode, and to predict the residual lifetime of the axle system. If one or more sensors are eliminated from the full configuration, it may in some cases not be possible to distinguish one or more damaging factors or failure modes from each other. The following lists some possible sensor configurations of the presently proposed sensor system:

1. IMU, thermometer, oil debris sensor, and viscosity sensor: This is usually the most complete configuration of sensors since it allows all the six failure modes depicted in FIG. 14 to be recognized and/or detected and/or predicted. The IMU allows monitoring the mechanical integrity of the entire axle, even in sub-networks that do not have an accelerometer (e.g. by identifying a damage in C—FIG. 5 when the IMU is placed in B—FIG. 6). In the latter case, the system may identify the failure mode of the axle, but may not be able to locate the sub-network in which the damage has occurred.

2. Thermometer, oil debris sensor, and viscosity sensor: With this setup it is possible to monitor and/or predict the aging of the lubrication oil (damaging factor-4), contamination of the oil (df-5), the minimum level of oil (df-6), and overheating of the rotating components (df-7). In some cases, the wear of rotating components (df-1) and breakage of rotating components (df-2) can be sensed only locally (that is in the same sub-network). In these cases this configuration may therefore not be capable of sensing if the mechanical frame of the axle is damaged (df-3).

3. IMU and oil debris sensor: This configuration may identify all the damaging modes or failure modes except for the aging of the lubrication mode (df-4). Thus, the accuracy in detecting wear of rotating components (df-1) may possibly be lower as vibrations may in some instances depend on the status (i.e. viscosity) of the lubrication oil.

4. Thermometer and viscosity sensor: With this pair of sensors it is possible to recognize and/or detect and/or predict the aging of the lubrication oil (df-4) and the overheating of rotating components (df-7).

However, it is understood that the sensor system is not limited to the specific examples described above and may comprise further configurations or combinations of sensors.

Axle Locations

Figure 15:
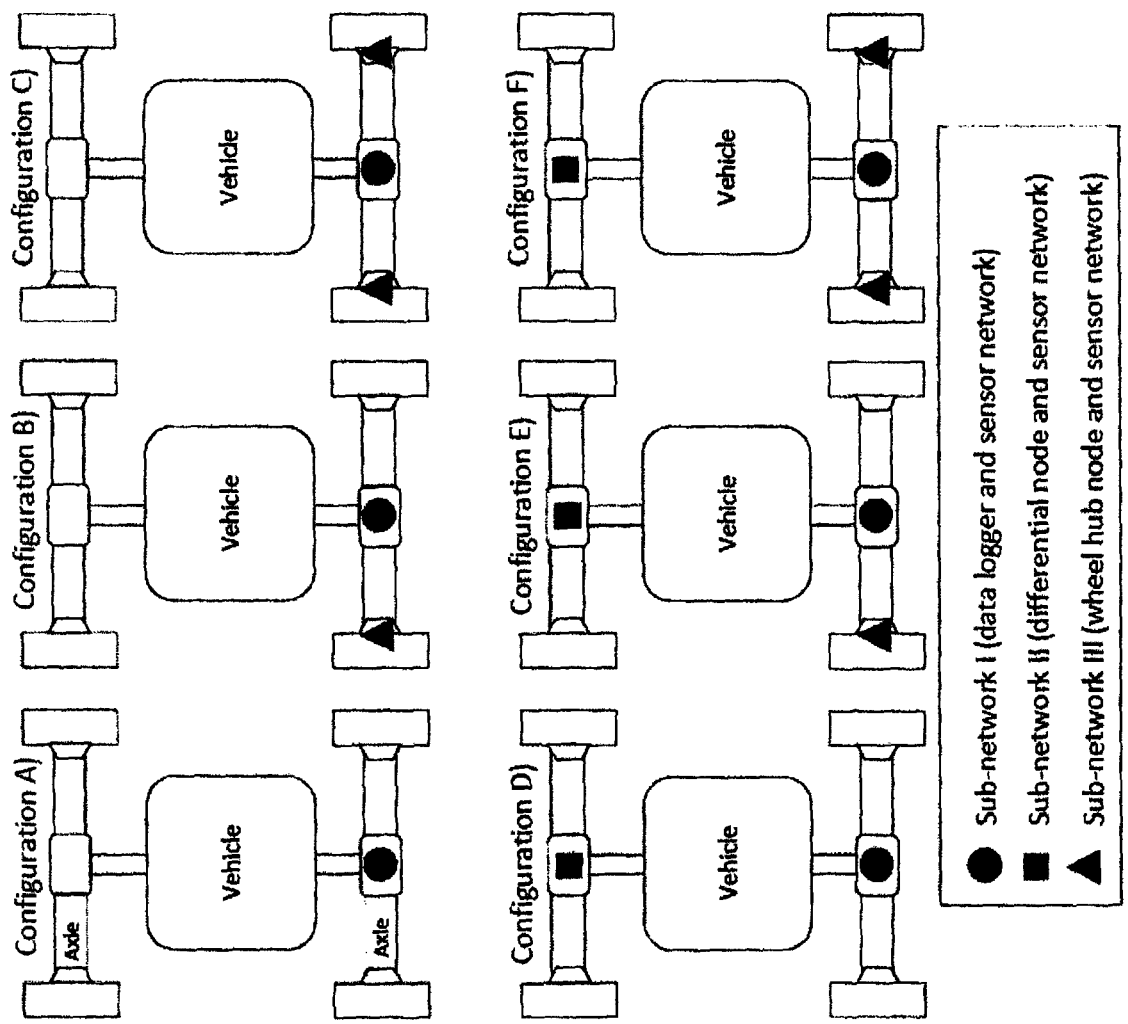
FIG. 15 shows various configurations of sensor sub-networks.

Once the sensor configuration of each sub-network has been tuned to its specific application, each sub-network (SN) is typically assigned a specific location within the axle arrangement. FIG. 15 depicts possible locations and configurations of the sub-networks in or on the axles of a two-axle vehicle (these considerations can be extended for a vehicle with a higher number of axles):

A) One sub-network of type-I inside or on only one axle or axle arrangement: This is typically the simplest configuration, and the sub-network may be placed in the central differential box of one axle. With this setup it is usually possible to monitor and/or to predict the status of the oil in the differential 10, to monitor the rotating components of the differential 10, and to detect when the axle frame is damaged. The health status of non-sensed differentials may be assessed based on the assumption that the degree of wear is the same or similar for all differentials included in the driveline.

B) One sub-network of type-I and one sub-network of type-III inside or on only one axle or axle arrangement: This configuration further allows measuring and/or predicting the status of the lubrication oil inside the wheel hub as well as measuring and/or predicting the condition of the rotating components inside the wheel hub. The health status of the wheel hubs which are not monitored may be assessed based on the assumption that the degree of wear is the same or similar for all wheel hubs included in the driveline.

C) One sub-network of type-I and two sub-networks of type-III inside or on only one axle or axle arrangement: This configuration further allows monitoring and/or predicting the health status of both wheel hubs. The health status of the wheel hubs which are not monitored may be assessed based on the assumption that wheel hubs on the same side of the vehicle (i.e. left or right) exhibit the same degree wear.

D) One sub-network of type-I and one (or more) sub-networks of type-II: Only one data processing unit is installed on the entire vehicle. The remaining axles typically include a central differential node in the central differential 10. This configuration further allows monitoring the health status of multiple central differentials. If the vehicle has more than two axles, more than one central differential node may be installed. In the latter case, the information collected by the data processing unit and the central differential nodes can be used to estimate and/or predict the health status of the differentials which are not monitored.

E) One sub-network of type-I, one (or more) sub-network of type-II, and one sub-network of type-III inside or one (or more) axle or axle arrangement: This configuration further allows monitoring the health status of the central differential

10 and one wheel hub of two or more axles. The health status of the wheel hubs which are not monitored may be assessed based on the assumption that wheel hubs on the same axle exhibit the same degree of wear. The health status of the axles which are not monitored may be predicted based on data acquired from the monitored axles, in analogy with the assumptions made for configuration B and D.

F) One sub-network of type-I, one (or more) sub-network of type-II, and two sub-networks of type-III inside or on one or more axles or axle arrangements: This configuration further allows monitoring and/or predicting the health status of both wheel hubs. The health status of the wheel hubs which are not monitored may be estimated in analogy with the assumptions made for configuration C.

G) One sub-network of type-I inside or on one axle, one sub-network of type-II for all remaining axles or axle arrangements, and two sub-networks of type-III inside or on all axles: This configuration permits sensing all central differentials 10 and wheel hubs of the vehicle. It is typically the most complete and robust configuration as it allows motoring and/or predicting the status and/or the lifetime of each critical zone of the axle or axle arrangement. The data collected from two or more of the axles may be merged in order to improve the accuracy of the learned models and/or in order to improve the reliability in identifying and predicting the axle failure modes.

The invention claimed is:

1. A method of monitoring a vehicle axle and of discriminating between a plurality of axle failure modes, the method comprising:
   acquiring first axle data and second axle data;
   detecting at least one first anomaly if the acquired first axle data deviate from first reference data provided by a model of the axle;
   detecting at least one second anomaly if the acquired second axle data deviate from second reference data;
   detecting at least one out of a plurality of axle failure modes based on which anomaly or which anomalies have been detected;
   issuing a failure notice indicative of the at least one detected axle failure mode;
   determining a current temperature rise time of lubricant disposed within an axle housing based on acquired temperature data associated with the lubricant; and
   detecting that the lubricant features an anomaly if the current temperature rise time of the lubricant is below a minimum temperature rise time of the lubricant provided by the model.

2. The method of claim 1, wherein acquiring the first axle data comprises acquiring at least one of axle acceleration data, axle attitude data, and axle temperature data, the axle temperature data relating to at least one of a rigid axle component and the lubricant disposed in an axle housing.

3. The method of claim 1, wherein acquiring the second axle data comprises acquiring at least one of axle acceleration data, axle attitude data, axle temperature data, ferrous debris data relating to ferrous debris dispersed in the lubricant, dielectricity data relating to a dielectric constant of the lubricant, and viscosity data relating to a viscosity of the lubricant.

4. The method of claim 1, wherein the model comprises a theoretical model of the axle, the method further comprising:
   running a classification algorithm to detect, based on the theoretical model and based on at least one of the first axle data and the second axle data, if the first axle data or the second axle data feature at least one of the first anomaly and the second anomaly.

5. The method of claim 1, wherein the model comprises at least one of a learned set of first axle data and a learned set of second axle data, corresponding to at least one of an intact axle and a defective axle, the method further comprising:
   running a classification algorithm to detect, based on at least one of the learned set of first axle data and the learned set of second axle data, and based on at least one of newly acquired first axle data and newly acquired second axle data, if the newly acquired first axle data or the newly acquired second axle data feature at least one of the first anomaly and the second anomaly.

6. The method of claim 1,
   wherein acquiring the first axle data comprises acquiring viscosity data associated with the lubricant;
   wherein acquiring the second axle data comprises acquiring at least one of temperature data associated with the lubricant, debris data including an abundance or a density of ferrous debris dispersed in the lubricant, and dielectricity data associated with the lubricant;
   wherein the model includes learned input data, the learned input data including at least one of learned temperature data associated with the lubricant, learned debris data associated with the lubricant, and learned dielectricity data associated with the lubricant, wherein the model includes learned viscosity data associated with the lubricant as output data, and wherein the model includes a regression function derived from the learned input data and from the learned output data, the regression function providing a defined relation between the learned input data and the learned output data; and
   wherein the first reference data provided by the model include an extrapolated lubricant viscosity, wherein the extrapolated lubricant viscosity is based on the acquired second axle data and on the regression function;
   the method further comprising:
   detecting that a viscosity of the lubricant features an anomaly if the acquired viscosity data associated with the lubricant deviates from the extrapolated viscosity by more than a predefined threshold.

7. The method of claim 1, wherein acquiring the second axle data comprises acquiring a time course of an abundance or of a density of ferrous debris dispersed in the lubricant, and wherein the second reference data include an upper threshold of the abundance or of the density or of a time derivative of the abundance or of the density of ferrous debris dispersed in the lubricant;
   the method further comprising:
   detecting that at least one of a rotating axle component, an axle frame and the lubricant features an anomaly if the acquired abundance or the acquired density or a time derivative of the abundance or of the density of ferrous debris dispersed in the lubricant exceeds the upper threshold.

8. The method of claim 1,
   wherein the model includes a plurality of learned data sets, each learned data set including at least one of learned first axle data and learned second axle data, each learned data set further including a point in time at which the learned data set was acquired; and
   wherein the model further includes a regression function derived from the learned data sets, the regression function providing a defined relation between the points in time at which the learned data sets were acquired and at least one of the first axle data and the second axle data included in the learned data sets;

the method further comprising:

determining, based on the regression function and based on one or more predetermined accepted ranges for at least one of the first axle data and the second axle data, when at least one of the first axle data and the second axle data are expected to lie outside their accepted range.

9. The method of claim 8, further comprising adding further learned data sets to the plurality of learned data sets during operation of the axle and during a time period beginning right after maintenance of the axle.

10. A method of monitoring a vehicle axle and of discriminating between a plurality of axle failure modes, the method comprising:

acquiring first axle data and second axle data from a first sensor and a second sensor selected from sensor types consisting of: an inertial measurement unit, a lubricant temperature sensor, a lubricant debris sensor, and a lubricant viscosity sensor, and the second sensor is a different type of sensor than the first sensor;

detecting at least one first anomaly if the acquired first axle data deviate from first reference data provided by a model of the axle;

detecting at least one second anomaly if the acquired second axle data deviate from second reference data provided by the model of the axle;

distinguishing between a plurality of axle failure modes based on a comparison of the type of the first sensor, type of the second sensor, indication of the first anomaly, indication of the second anomaly, and data correlating the plurality of axle failure modes to combinations of anomalies and sensor types;

determining a current temperature rise time of lubricant disposed within an axle housing; and detecting that the lubricant features an anomaly if the current temperature rise time of the lubricant is below a minimum temperature rise time of the lubricant; and issuing a failure notice indicative of the at least one detected axle failure mode.

11. The method of claim 10, further comprising:

determining a status of a vehicle the axle is disposed in, the vehicle status comprising at least one of a rotational speed of at least one vehicle wheel, a rotational speed of at least one transmission shaft, a rotational speed of at least one axle shaft, a gear selection, and an engine speed; and adapting the model based on the vehicle status, so that at least one of the first reference data and the second reference data provided by the model is dependent on the vehicle status.

12. The method of claim 10, wherein at least one of the first reference data and the second reference data provided by the model include learned axle vibrational data acquired from an intact axle; and wherein at least one of acquiring the first axle data and acquiring the second axle data comprises acquiring axle vibrational data;

the method further comprising:

running a classification algorithm to classify the acquired axle vibrational data as at least one of coinciding with the learned axle vibrational data and deviating from the learned axle vibrational data; and detecting that a rotating component of the axle or of an axle frame features an anomaly if the acquired axle vibrational data is classified as deviating from at least one of the first reference data and the second reference data.

13. The method of claim 10, wherein at least one of the first reference data and the second reference data include predicted spectral features of axle vibrational data associated with a modelled defective axle, and wherein at least one of acquiring the first axle data and acquiring the second axle data comprises acquiring axle vibrational data;

the method further comprising:

detecting that at least one of a rotating axle component and an axle frame features an anomaly if the predicted spectral features of axle vibrational data associated with the modelled defective axle are present in the acquired axle vibrational data.

14. The method of claim 10, wherein the model includes learned temperature data associated with the lubricant, wherein at least one of acquiring the first axle data and acquiring the second axle data includes acquiring temperature data associated with the lubricant, wherein at least one of the first reference data and the second reference data provided by the model includes the minimum temperature rise time of the lubricant, and wherein the minimum temperature rise time of the lubricant is based on the learned temperature data; and wherein the determining of the current temperature rise time of the lubricant is based on the acquired temperature data associated with the lubricant.

15. The method of claim 10, wherein the model includes learned dielectricity data associated with the lubricant, wherein at least one of the first reference data and the second reference data provided by the model include an acceptable range of a dielectric constant of the lubricant, wherein the acceptable range of the dielectric constant of the lubricant is based on the learned dielectricity data, and wherein at least one of acquiring the first axle data and acquiring the second axle data comprises acquiring dielectricity data associated with the lubricant;

the method further comprising:

determining, based on the acquired dielectricity data, a current dielectric constant of the lubricant; and detecting that the lubricant features an anomaly if the current dielectric constant of the lubricant derived from the acquired dielectricity data lies outside the acceptable range provided by the model.

16. The method of claim 10, further comprising a third sensor selected from the sensor types, and the third sensor being a different type from the first sensor and the second sensor; and the distinguishing between the plurality of axle failure modes being based on the type of the third sensor and an indication of a third anomaly based on the third sensor data.

17. The method of claim 16, wherein the plurality of failure modes distinguished between comprises wear of rotating parts, breakage of rotating parts, damage to structure of the axle, degradation of the lubricant, and contamination of the lubricant.

18. The method of claim 17, wherein the plurality of failure modes distinguished between further comprises low lubricant level and excessive lubricant temperature.

19. The method of claim 17, wherein the oil debris sensor includes indications for contamination, fine particle debris, coarse particle debris, and dielectric variance, and the plurality of failure modes distinguished between further comprises lubricant viscosity degradation.

20. The method of claim 10, wherein the first axle data and the second axle data are gathered from a wheel hub node and a central differential node.

* * * * *